(12) United States Patent
Kim et al.

(10) Patent No.: US 12,211,758 B2
(45) Date of Patent: Jan. 28, 2025

(54) SEMICONDUCTOR DEVICES HAVING A DEFECT DETECTOR AND DATA STORAGE SYSTEMS INCLUDING THE SAME

(71) Applicant: SAMSUNG ELECTRONICS CO., LTD., Suwon-si (KR)

(72) Inventors: Kyounghoon Kim, Seoul (KR); Gaeun Kim, Hwaseong-si (KR); Joohee Park, Suwon-si (KR); Seokwoo Hong, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 512 days.

(21) Appl. No.: 17/558,803

(22) Filed: Dec. 22, 2021

(65) Prior Publication Data

US 2022/0336298 A1 Oct. 20, 2022

(30) Foreign Application Priority Data

Apr. 16, 2021 (KR) ........................ 10-2021-0049979

(51) Int. Cl.
| | |
|---|---|
| *H01L 23/535* | (2006.01) |
| *H01L 21/66* | (2006.01) |
| *H10B 12/00* | (2023.01) |
| *H10B 41/27* | (2023.01) |
| *H10B 41/41* | (2023.01) |
| *H10B 43/27* | (2023.01) |
| *H10B 43/40* | (2023.01) |

(52) U.S. Cl.
CPC ............ *H01L 22/32* (2013.01); *H01L 23/535* (2013.01); *H10B 12/50* (2023.02); *H10B 41/27* (2023.02); *H10B 41/41* (2023.02); *H10B 43/27* (2023.02); *H10B 43/40* (2023.02); *H01L 22/34* (2013.01); *H01L 2225/06596* (2013.01)

(58) Field of Classification Search
CPC ......... H01L 22/10–14; H01L 22/30–34; H01L 23/562; H01L 23/564; H01L 23/58–585; H01L 2225/06596; H05K 1/0268; H10B 41/10; H10B 41/20; H10B 41/40; H10B 41/42; H10B 41/50; H10B 43/10; H10B 43/20; H10B 43/40; H10B 43/50
See application file for complete search history.

(56) References Cited

U.S. PATENT DOCUMENTS

| | | |
|---|---|---|
| 9,806,093 B2 | 10/2017 | Toyama et al. |
| 10,685,914 B2 | 6/2020 | Lee |
| 10,720,441 B2 | 7/2020 | Kam et al. |
| 2020/0294869 A1 | 9/2020 | Jeong et al. |
| 2020/0402992 A1 | 12/2020 | Otsu et al. |

(Continued)

FOREIGN PATENT DOCUMENTS

| | | |
|---|---|---|
| KR | 10-1022580 B1 | 3/2011 |
| WO | WO 2010/019992 A1 | 2/2010 |

*Primary Examiner* — Nicholas J Tobergte
*Assistant Examiner* — William H Anderson
(74) *Attorney, Agent, or Firm* — Muir Patent Law, PLLC

(57) ABSTRACT

A semiconductor device and data storage system, the device including a substrate having a first region, a second region surrounding the first region, and a third region surrounding the second region; a memory structure on the first region; a first defect detector on the second region; and a dam structure on the third region, wherein the dam structure surrounds the first defect detector and includes a plurality of conductive lines stacked on the third region.

20 Claims, 22 Drawing Sheets

(56) References Cited

U.S. PATENT DOCUMENTS

| | | | |
|---|---|---|---|
| 2021/0074596 A1* | 3/2021 | Kim | H01L 22/34 |
| 2021/0296299 A1* | 9/2021 | Shibata | H01L 24/94 |
| 2022/0068885 A1* | 3/2022 | Lee | G11C 5/025 |
| 2022/0085052 A1* | 3/2022 | Watarai | H10B 41/30 |
| 2022/0285234 A1* | 9/2022 | Yokomizo | H01L 24/80 |

* cited by examiner

SEMICONDUCTOR DEVICES HAVING A DEFECT DETECTOR AND DATA STORAGE SYSTEMS INCLUDING THE SAME

CROSS TO REFERENCE TO RELATED APPLICATION

This application claims benefit of priority to Korean Patent Application No. 10-2021-0049979 filed on Apr. 16, 2021 in the Korean Intellectual Property Office, the disclosure of which is incorporated herein by reference in its entirety.

BACKGROUND

1. Field

Embodiments relate to a semiconductor device and a data storage system including the same.

2. Description of the Related Art

A semiconductor device may store high-capacity data in a data storage system requiring data storage. Accordingly, a measure for increasing data storage capacity of a semiconductor device has been considered.

SUMMARY

The embodiments may be realized by providing a semiconductor device including a substrate having a first region, a second region surrounding the first region, and a third region surrounding the second region; a memory structure on the first region; a first defect detector on the second region; and a dam structure on the third region, wherein the memory structure includes driving circuits including a first circuit gate electrode layer, a first lower interconnection structure including first lower interconnection lines and first lower contact plugs on the driving circuits, a plate layer on the first lower interconnection structure, gate electrodes stacked and spaced apart from each other on the plate layer in a first direction perpendicular to an upper surface of the plate layer, channel structures penetrating the gate electrodes, extending in the first direction, and each including a channel layer, a first upper interconnection structure on the gate electrodes and the channel structures and including first upper interconnection lines and first upper contact plugs, and first through vias extending in the first direction and connecting the first upper interconnection structure to the first lower interconnection structure, the first defect detector includes a second circuit gate electrode layer, a second lower interconnection structure including second lower interconnection lines and second lower contact plugs connected to the second circuit gate electrode layer, second through vias on the second lower interconnection structure, and a second upper interconnection structure on the second through vias and including second upper interconnection lines and second upper contact plugs, the dam structure surrounds the first defect detector and includes a plurality of conductive lines stacked on the third region, in the first defect detector, the second circuit gate electrode layer, the second lower interconnection structure, the second through vias, and the second upper interconnection structure surround the memory structure, and the second through vias are connected to an uppermost second lower interconnection line among the second lower interconnection lines, have a first length in an extension direction of the uppermost second lower interconnection line, and have a second length less than the first length in a direction perpendicular to the extension direction.

The embodiments may be realized by providing a semiconductor device including a substrate; a memory structure on the substrate and including memory cells; a first defect detector surrounding the memory structure; and a dam structure surrounding the first defect detector, wherein the first defect detector includes a circuit gate electrode layer on the substrate, a lower interconnection structure connected to the circuit gate electrode layer and including lower interconnection lines and lower contact plugs, through vias on the lower interconnection structure, and an upper interconnection structure on the through vias and including upper interconnection lines and upper contact plugs, the dam structure includes a plurality of conductive lines surrounding the first defect detector and being vertically stacked, the first defect detector has a first circuit region surrounding the memory structure and a second circuit region on one end of the first circuit region, in the first defect detector, the circuit gate electrode layer, at least a portion of the lower interconnection structure, and the upper interconnection lines are in the first circuit region and the second circuit region, and the through vias and the upper contact plugs are in the second circuit region, and the through vias are connected to an uppermost lower interconnection line among the lower interconnection lines, have a first length in an extension direction of the uppermost lower interconnection line, and have a second length smaller than the first length in a direction perpendicular to the extension direction.

The embodiments may be realized by providing a data storage system including a semiconductor storage device including a substrate, a memory structure including driving circuits and memory cells on the substrate, a defect detector surrounding the memory structure, a dam structure surrounding the defect detector, and an input/output pad electrically connected to the driving circuits; and a controller electrically connected to the semiconductor storage device through the input/output pad and controlling the semiconductor storage device, wherein the defect detector includes a circuit gate electrode layer on the substrate, a lower interconnection structure connected to the circuit gate electrode layer and including lower interconnection lines and lower contact plugs, through vias on the lower interconnection structure, and an upper interconnection structure on the through vias and including upper interconnection lines and upper contact plugs, the dam structure includes a plurality of conductive lines surrounding the defect detector and being vertically stacked, and the through vias are connected to an uppermost lower interconnection line among the lower interconnection lines, have a first length in an extension direction of the uppermost lower interconnection line, and have a second length smaller than the first length in a direction perpendicular to the extension direction.

BRIEF DESCRIPTION OF DRAWINGS

Features will be apparent to those of skill in the art by describing in detail exemplary embodiments with reference to the attached drawings in which.

DETAILED DESCRIPTION

Figure 1A:
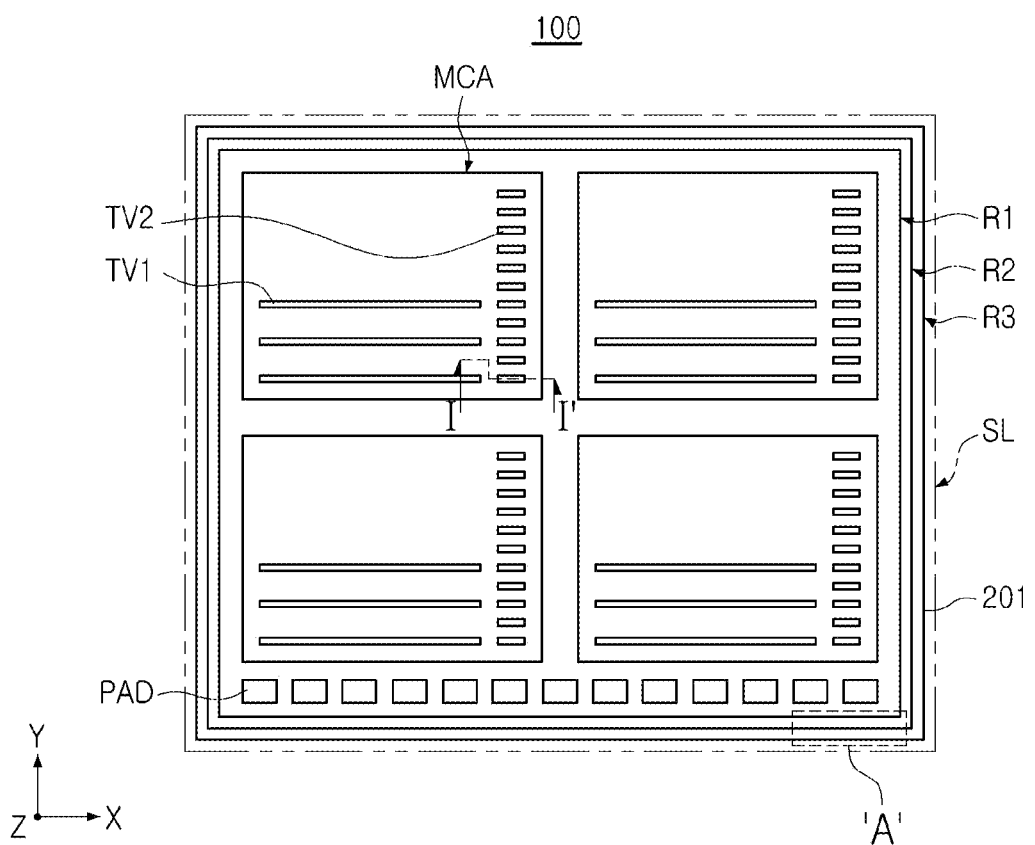
FIGS. 1A and 1B are plan views of a semiconductor device according to an example embodiment of the present disclosure.
Figure 1B:
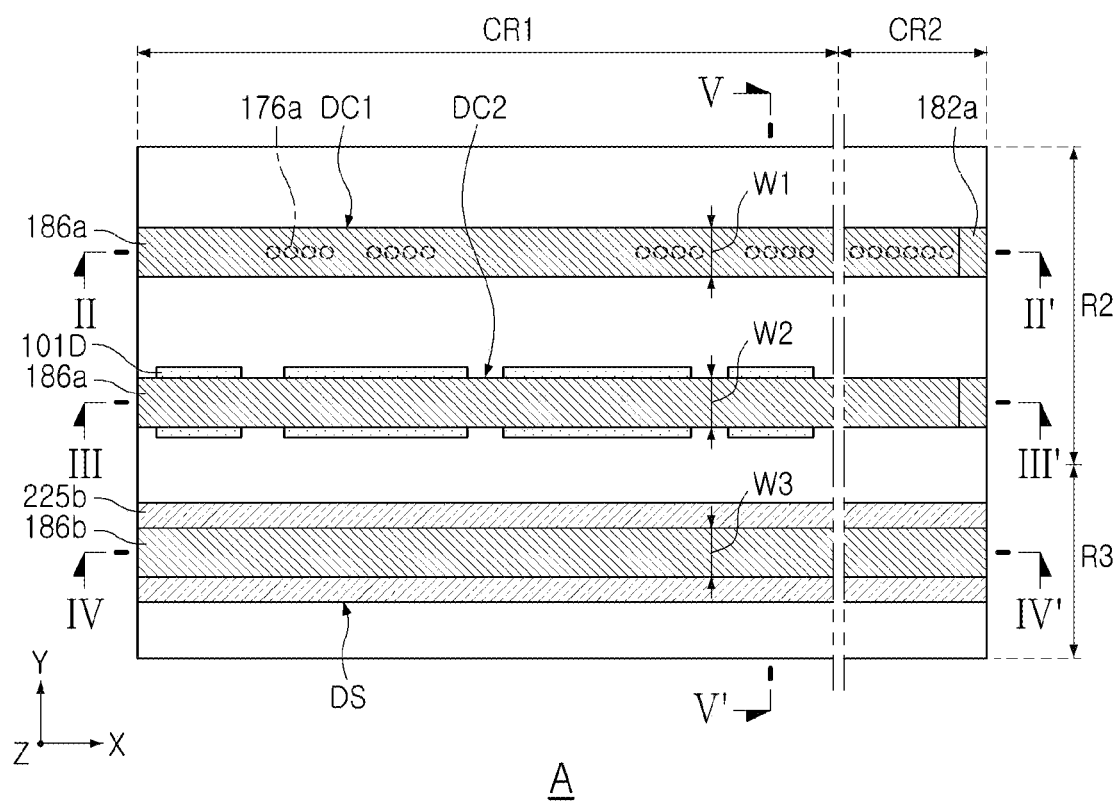

FIGS. 1A and 1B are plan views of a semiconductor device according to an example embodiment. FIG. 1B is an enlarged view of region "A" in FIG. 1A.

Figure 2A:
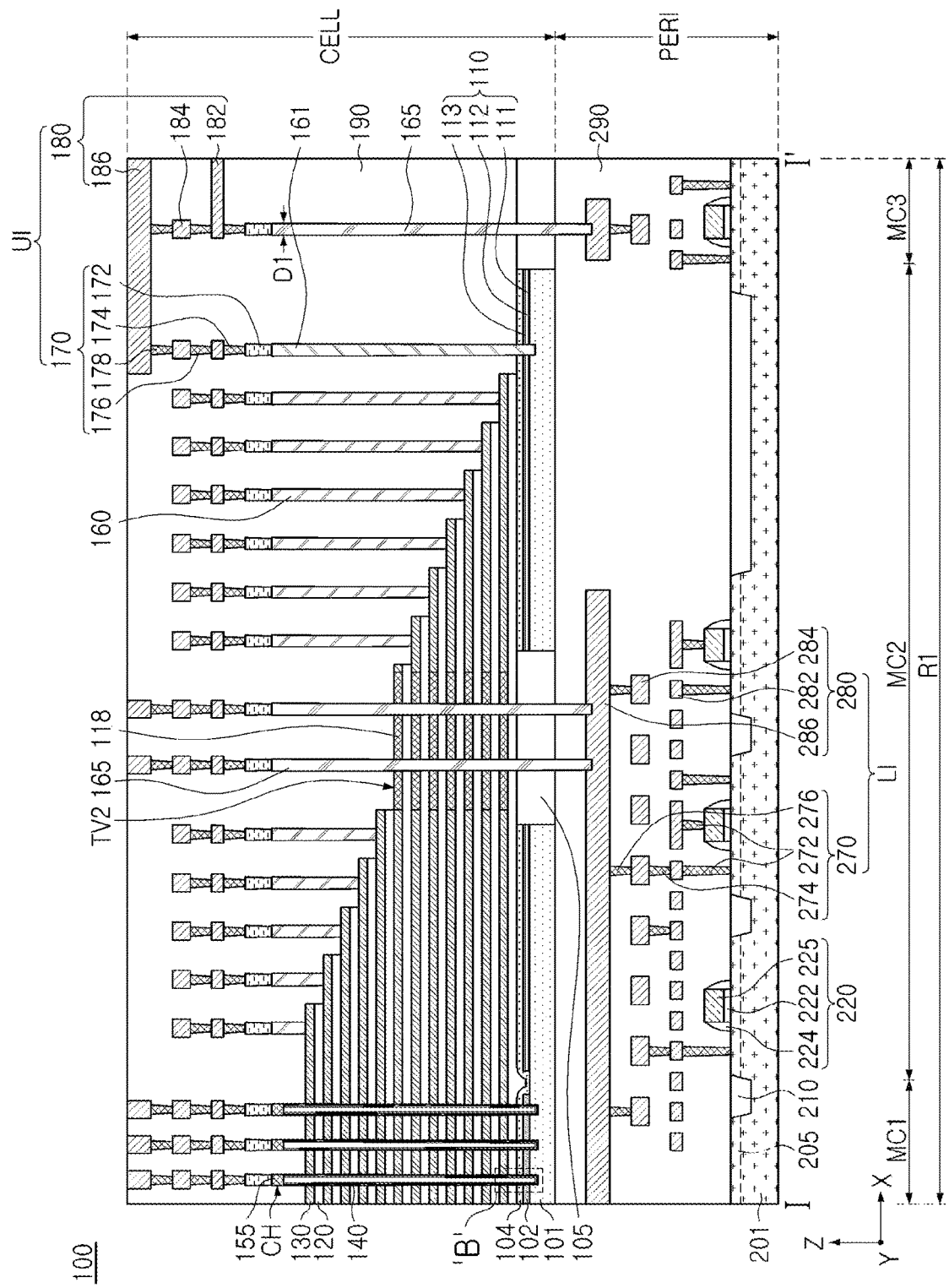
FIGS. 2A to 2E are cross-sectional views of a semiconductor device according to an example embodiment of the present disclosure.

FIGS. 2A to 2E are cross-sectional views of a semiconductor device according to an example embodiment. FIG. 2A is a cross-sectional view taken along line I-I' in FIG. 1A. FIGS. 2B to 2E are cross-sectional views taken along lines II-II', III-III', IV-IV', and V-V' in FIG. 1B.

Figure 2B:
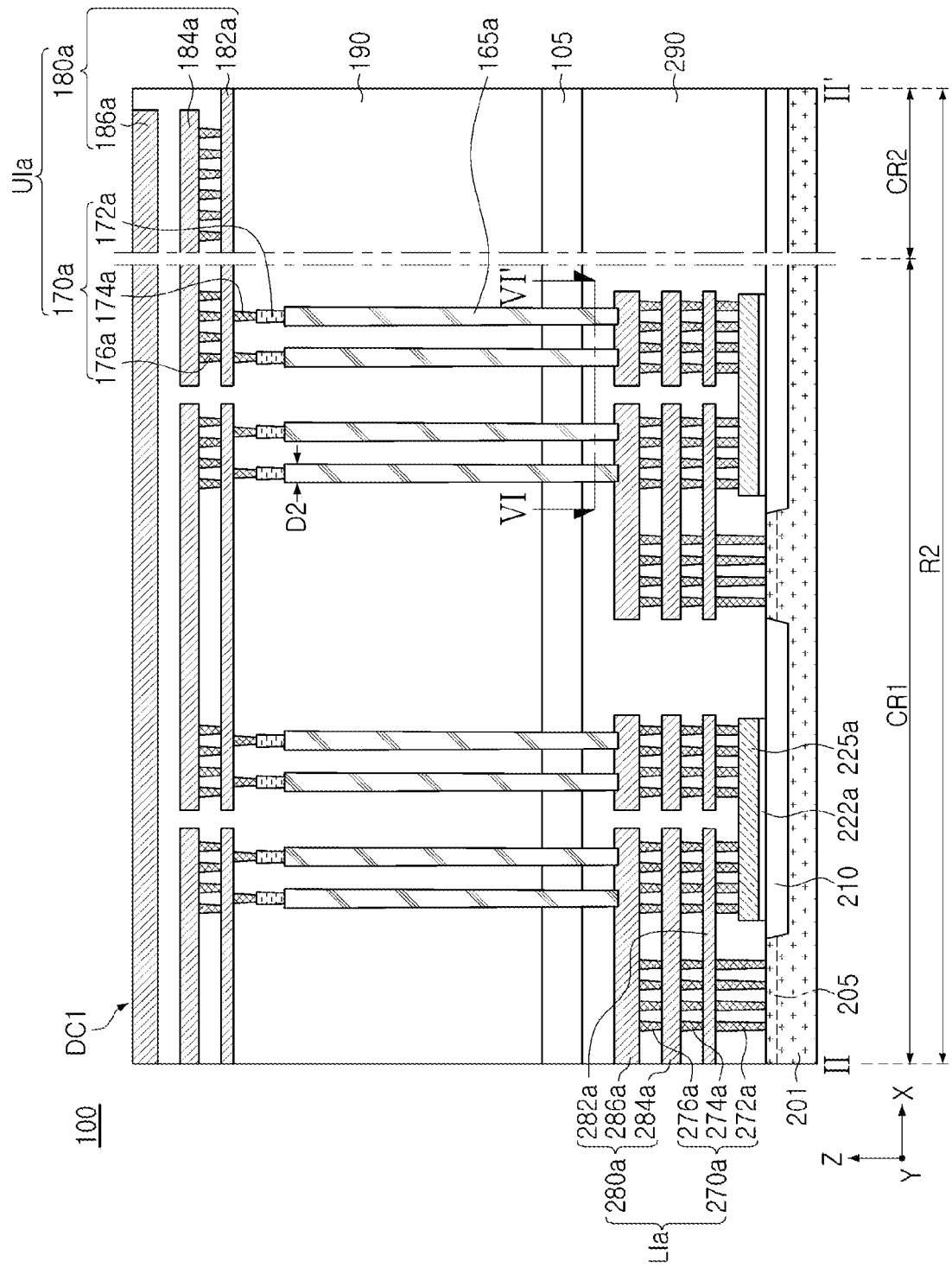
Figure 3:
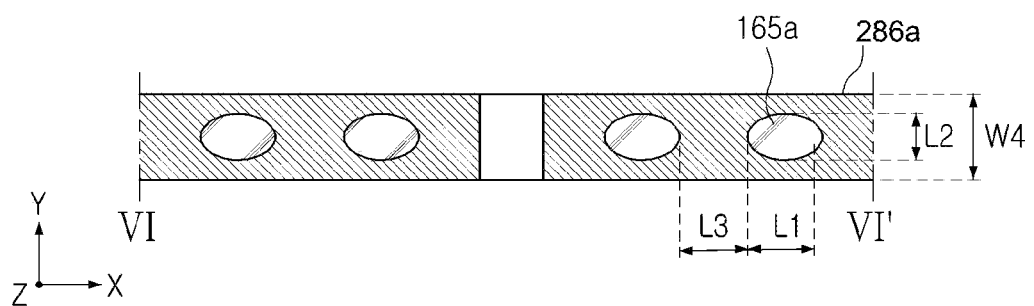
FIG. 3 is a plan view of a semiconductor device according to an example embodiment of the present disclosure.

FIG. 3 is a plan view of a semiconductor device taken along line VI-VI' in FIG. 2B according to an example embodiment.

Referring to FIGS. 1A and 1B, a semiconductor device 100 may include a substrate 201 including a first region R1, a second region R2 surrounding the first region R1, and a third region R3 surrounding the second region R2. On the first region R1, a memory structure including the memory cell arrays MCA may be disposed, and on the second region R2, defect detection devices or defect detectors DC1 and DC2 may be disposed. On the third region R3, a dam structure DS for protecting the semiconductor device 100 may be disposed. Hereinafter, the first region R1, the second region R2, and the third region R3 may be described as regions of the substrate 201, or regions on a plan view of the semiconductor device 100.

Memory cell arrays MCA including memory cells and pad regions PAD may be on the first region R1. As described below with reference to FIG. 2A, a peripheral circuit region PERI including driving circuits 220 for driving the memory cells may be below the memory cell region CELL of the memory cell arrays MCA.

The plurality of memory cell arrays MCA may be spaced apart from each other. In an implementation, as illustrated in FIG. 1A, four memory cell arrays MCA may be present, or the number and arrangement form of the memory cell arrays MCA may be varied. First and second through interconnection regions TV1 and TV2 may be in the memory cell arrays MCA and may electrically connect the memory cells to the peripheral circuit region PERI. The first through interconnection regions TV1 may be in the memory cell arrays MCA with a predetermined distance therebetween. The second through interconnection regions TV2 may be along at least one end of the memory cell arrays MCA. In an implementation, the shape, number, arrangement position of the first and second through interconnection regions TV1 and TV2 may be varied.

The pad regions PAD may be on at least one side of the memory cell arrays MCA, and, e.g., may be in a row along at least one edge of the first region R1. In an implementation, the pad regions PAD may be arranged in a column between the memory cell arrays MCA. The pad regions PAD may be configured to transmit an electrical signal to and receive an electrical signal from an external device.

On the second region R2, the first and second defect detectors DC1 and DC2 (for detecting defects occurring during a process of manufacturing the semiconductor device 100) may be disposed. The first and second defect detectors DC1 and DC2 may include, e.g., a chipping detect circuit (CDC) for detecting chipping occurring during a sawing process. The second region R2 may be at an outer region of the semiconductor device 100 along with the third region R3. In an implementation, the second region R2 and the third region R3 may be, e.g., within about 10 μm, or within about 5 μm, of edges of the semiconductor device 100.

The third region R3 may be a region on which a dam structure DS for protecting the semiconductor device 100 is disposed. The third region R3 may be adjacent to a scribe lane SL, which may be sawed during a sawing process, and may form an outermost region of the semiconductor device 100 after the sawing process.

Referring to FIG. 2A, the memory structure of the semiconductor device 100 may include a peripheral circuit region PERI including a substrate 201, which may be a first semiconductor structure, and a memory cell region CELL including a plate layer 101, which may be a second semiconductor structure. The memory cell region CELL may be on the peripheral circuit region PERI. In an implementation, the memory cell region CELL may be below the peripheral circuit region PERI.

The peripheral circuit region PERI may include a substrate 201, active regions 205 and device isolation layers 210 in the substrate 201, and driving circuits 220 on the substrate 201, a peripheral region insulating layer 290, and a lower interconnection structure LI.

The substrate 201 may have an upper surface extending in the X direction and the Y direction (e.g., in an X-Y plane). The active regions 205 may be defined in the substrate 201 by the device isolation layers 210. The active regions 205 may include impurity regions such as source/drain regions. The substrate 201 may include a semiconductor material, e.g., a group IV semiconductor, a group III-V compound semiconductor, or a group II-VI compound semiconductor. The substrate 201 may be provided as a bulk wafer or as an epitaxial layer.

The driving circuits 220 may include a planar transistor. Each of the driving circuits 220 may include a circuit gate dielectric layer 222, a spacer layer 224, and a circuit gate electrode layer 225. Source/drain regions may be further included in the active regions 205 on or at both sides of the circuit gate electrode layer 225.

The peripheral region insulating layer 290 may be on the driving circuit 220 on the substrate 201. The peripheral region insulating layer 290 may be formed of an insulating material and may include a plurality of insulating layers.

The lower interconnection structure LI may be an interconnection structure electrically connected to the driving circuits 220 and the active regions 205. The lower interconnection structure LI may include lower contact plugs 270 having a cylindrical shape and lower interconnection lines 280 having a linear shape. The lower contact plugs 270 may include first to third lower contact layers 272, 274, and 276. The lower interconnection lines 280 may include first to third lower interconnection layers 282, 284, and 286. The first lower contact layers 272 may be on the driving circuits 220 and the active regions 205, the second lower contact layers 274 may be on the first lower interconnection layers 282, and the third lower contact layers 276 may be on the second lower interconnection layers 284. The first lower interconnection layers 282 may be on the first lower contact layers 272, the second lower interconnection layers 284 may be on the second lower contact layers 274, and the third lower interconnection layer may be on the third lower contact layers 276. The lower interconnection structure LI may include a conductive material, e.g., tungsten (W), copper (Cu), aluminum (Al), or the like, and each of the elements may further include a diffusion barrier. In an implementation, the number and arrangement of the lower contact plugs 270 and the lower interconnection lines 280 forming the lower interconnection structure LI may be varied.

The memory cell region CELL may include a plate layer 101 having a first cell region MC1 and a second cell region MC2, first and second horizontal layers 102 and 104 on the plate layer 101, the gate electrodes 130 stacked on the plate layer 101, channel structures CH penetrating the stack structure of the gate electrodes 130, and an upper interconnection structure UI electrically connected to the gate electrodes 130 and the channel structures CH. The memory cell region CELL may further include a substrate insulating layer 105, a horizontal insulating layer 110 on the second cell region MC2, interlayer insulating layers 120 alternately stacked with the gate electrodes 130 on the plate layer 101, gate contacts 160 connected to the gate electrodes 130, a plate contact 161 connected to the plate layer 101, through vias 165 connecting the lower interconnection structure LI to the upper interconnection structure UI, and a cell region insulating layer 190 covering the gate electrodes 130. The memory cell region CELL may further include a third cell region MC3 on or at an external side of the plate layer 101, and a through-wiring structure (such as a through via 165) connecting the memory cell region CELL to the peripheral circuit region PERI may be on the third cell region MC3.

On the first cell region MC1, the gate electrodes 130 may be vertically stacked and the channel structures CH may be disposed. Memory cells may be on the first cell region MC1. On the second cell region MC2, the gate electrodes 130 may extend (e.g., in the X direction) different lengths, and on the second cell region MC2, the memory cells may be electrically connected to the peripheral circuit region PERI. The second cell region MC2 may be on at least one end of the first cell region MC1 in at least one direction, e.g., in the X direction.

The plate layer 101 may have an upper surface extending in the X direction and the Y direction. The plate layer 101 may include a semiconductor material, e.g., a group IV semiconductor, a group III-V compound semiconductor, or a group II-VI compound semiconductor. In an implementation, the group IV semiconductor may include silicon, germanium, or silicon-germanium. The plate layer 101 may further include impurities. The plate layer 101 may be a polycrystalline semiconductor layer such as a polycrystalline silicon layer, or an epitaxial layer.

The first and second horizontal layers 102 and 104 may be stacked on the upper surface of the first cell region MC1. The first horizontal layer 102 may function as a portion of the common source line of the semiconductor device 100, e.g., and may function as a common source line together with the plate layer 101. The first horizontal layer 102 may not extend to the second cell region MC2, and the second horizontal layer 104 may also be on the second cell region MC2.

The first and second horizontal layers 102 and 104 may include a semiconductor material, e.g., polycrystalline silicon. In this case, at least the first horizontal layer 102 may be doped with impurities, and the second horizontal layer 104 may be a doped layer or may include impurities diffused from the first horizontal layer 102. In an implementation, the second horizontal layer 104 may be an insulating layer.

The horizontal insulating layer 110 may be parallel to the first horizontal layer 102 on a portion of the second cell region MC2. The horizontal insulating layer 110 may include first to third horizontal insulating layers 111, 112, and 113 stacked in order on the plate layer 101. The first to third horizontal insulating layers 111, 112, and 113 may be layers remaining after a portion of the first to third horizontal insulating layers 111, 112, and 113 are replaced with the first horizontal layer 102 in the process of manufacturing the semiconductor device 100. In an implementation, the arrangement of regions in which the first to third horizontal insulating layers 111, 112, and 113 remain in the second cell region MC2 may be varied.

The first and third horizontal insulating layers 111 and 113 and the second horizontal insulating layer 112 may include different insulating materials. The first and third horizontal insulating layers 111 and 113 may include the same material. In an implementation, the first and third horizontal insulating layers 111 and 113 may be formed of the same material as that of the interlayer insulating layers 120, and the second horizontal insulating layer 112 may be formed of the same material as that of the sacrificial insulating layers 118.

The substrate insulating layer 105 may be on a region on the peripheral region insulating layer 290 from which a portion of the plate layer 101, the horizontal insulating layer 110, and the second horizontal layer 104 are removed. A lower surface of the substrate insulating layer 105 may be coplanar with a lower surface of the plate layer 101 or may be on a level lower than a level of the lower surface of the plate layer 101. In an implementation, the substrate insulating layer 105 may include a plurality of layers stacked in the Z direction. The substrate insulating layer 105 may be formed of an insulating material, e.g., silicon oxide, silicon oxynitride, or silicon nitride.

The gate electrodes 130 may be vertically stacked and spaced apart from each other on the plate layer 101 and may form a stack structure. The gate electrodes 130 may include electrodes forming a ground select transistor, memory cells, and a string select transistor in order from the plate layer 101. The number of gate electrodes 130 forming the memory cells may be determined according to capacity of the semiconductor device 100. In an implementation, each of the number of gate electrodes 130 forming the string select transistor and the number of gate electrodes 130 forming the ground select transistor may be one or two or more, and may have the same structure as or a different structure from that of the gate electrodes 130 of the memory cells. In an implementation, the gate electrodes 130 may further include a gate electrode 130 above the gate electrodes 130 forming the string select transistor or below the gate electrodes 130 forming the ground select transistor, and forming an erase transistor used in an erase operation using a gate induced drain leakage (GIDL) phenomenon. In an implementation, a portion of the gate electrodes 130, the gate electrodes 130 adjacent to the gate electrodes 130 forming the string select transistor and the ground select transistor, e.g., may be dummy gate electrodes.

The gate electrodes 130 may be vertically stacked and spaced apart from each other on the first cell region MC1, may extend from the first cell region MC1 to the second cell region MC2 by different lengths and may form a stepped structure formed in a staircase shape. As illustrated in FIG. 2A, the gate electrodes 130 may have a stepped structure formed in the X direction and may have a stepped structure formed in the Y direction as well. Due to the stepped structure, the gate electrodes 130 may form a staircase shape in which the lower gate electrode 130 extends longer than the upper gate electrode 130, and may provide ends exposed upwardly from the interlayer insulating layers 120. In an implementation, the shape of the stepped structure may be varied. In an implementation, a height of the stack structure of the gate electrodes 130 may not be continuously lowered in the X direction, and there may be a region in which the height may be lowered and increased.

The gate electrodes 130 may include a metal material, e.g., tungsten (W). In an implementation, the gate electrodes 130 may include polycrystalline silicon or a metal silicide material. In an implementation, the gate electrodes 130 may further include a diffusion barrier layer, and the diffusion barrier layer may include, e.g., tungsten nitride (WN), tantalum nitride (TaN), titanium nitride (TiN), or a combination thereof.

The interlayer insulating layers 120 may be between the gate electrodes 130. Similarly to the gate electrodes 130, the interlayer insulating layers 120 may be spaced apart from each other in a direction perpendicular to the upper surface of the plate layer 101 and may extend in the X direction. The interlayer insulating layers 120 may include an insulating material such as silicon oxide or silicon nitride.

Each of the channel structures CH may form a single memory cell string, and may be spaced apart from each other on the first cell region MC1 while forming rows and columns. The channel structures CH may form a grid pattern or may be in a zigzag pattern in one direction on the X-Y plane. The channel structures CH may have a columnar shape, and may have an inclined side surface of which a width may decrease toward the plate layer 101 depending on an aspect ratio. In an implementation, the stack structure of the gate electrodes 130 may include lower and upper stack structures vertically stacked. In this case, the channel structures CH may include lower and upper channel structures stacked and connected to each other.

Channel pads 155 may be on an upper end of the channel structures CH. The channel pads 155 may be electrically connected to the channel layer 140. The channel pads 155 may include, e.g., doped polycrystalline silicon. A specific internal structure of the channel structures CH will be described in greater detail with reference to FIGS. 4A and 4B.

The cell region insulating layer 190 may cover the plate layer 101, the gate electrodes 130, and the substrate insulating layer 105. The cell region insulating layer 190 may be formed of an insulating material and may include a plurality of insulating layers.

The gate contacts 160 may be connected to the gate electrodes 130 on the second cell region MC2. The gate contacts 160 may penetrate a portion of the cell region insulating layer 190 and to be connected to the gate electrodes 130 exposed upwardly, respectively. The plate contact 161 may be connected to the plate layer 101 on an end of the second cell region MC2. The plate contact 161 may penetrate a portion of the cell region insulating layer 190, may penetrate the second horizontal layer 104 exposed upwardly and the horizontal insulating layer 110 therebelow, and may be connected to the plate layer 101. In an implementation, the plate contact 161 may apply an electrical signal to a common source line including the plate layer 101.

The upper interconnection structure UI may be an interconnection structure electrically connected to the gate electrodes 130 and the channel structures CH. The upper interconnection structure UI may include upper contact plugs 170 having a column shape and upper interconnection lines 180 having a linear shape. The upper contact plugs 170 may include first to fourth upper contact layers 172, 174, 176, and 178. The upper interconnection lines 180 may include first to third upper interconnection layers 182, 184, and 186. The first upper contact layers 172 may be on the channel pads 155, the gate contacts 160, and the through vias 165 in a stud shape, the second upper contact layers 174 may be on the first upper contact layers 172, the third upper contact layers 176 may be on the first upper interconnection layers 182, and the fourth upper contact layers 176 may be on the second upper interconnection layers. The first upper interconnection layers 182 may be on the second upper contact layers 174, the second upper interconnection layers 184 may be on the third upper contact layers 176, and the third upper interconnection layer 186 may be on the fourth upper contact layers 178. The upper interconnection structure UI may include a conductive material, e.g., tungsten (W), copper (Cu), aluminum (Al), or the like, and may further include a diffusion barrier layer. In an implementation, the number of layers and arrangement of the upper contact plugs 170 and the upper interconnection lines 180 forming the upper interconnection structure UI may be varied.

The second through interconnection region TV2 may include through vias 165 penetrating the plate layer 101 from an upper portion of the memory cell region CELL and extending in the Z direction, and a through insulating region surrounding the through vias 165. The through insulating region may include sacrificial insulating layers 118, interlayer insulating layers 120 disposed perpendicularly to the sacrificial insulating layers 118, and a substrate insulating layer 105. In an implementation, the size, arrangement, and shape of the second through interconnection region TV2 may be varied.

The through vias 165 may penetrate a portion of the cell region insulating layer 190, the through insulating region, and the peripheral region insulating layer 290 from an upper portion and may extend perpendicularly to the upper surface of the plate layer 101. A portion of the through vias 165 may be on the third cell region MC3 of the memory cell region CELL, which is an external region of the plate layer 101, and may extend to the peripheral circuit region PERI. Upper ends of the through vias 165 may be connected to the upper interconnection structure UI, and lower ends of the through vias 165 may be connected to the lower interconnection structure LI. In an implementation, the number, arrangement, and shape of the through vias 165 in the second through interconnection region TV2 may be varied. The through via 165 may include a conductive material, e.g., a metal material such as tungsten (W), copper (Cu), or aluminum (Al).

The sacrificial insulating layers 118 may be on the same level as a level of the gate electrodes 130 and have the same thickness as that of the gate electrodes 130, and side surfaces of the sacrificial insulating layers 118 may be in contact with the gate electrodes 130 on a boundary of the second through interconnection region TV2. The sacrificial insulating layers 118 may be alternately stacked with the interlayer insulating layers 120 and may form the through insulating region. The sacrificial insulating layers 118 may have the same width as or a width different from that of the substrate insulating layer 105 disposed therebelow. The sacrificial insulating layers 118 may be formed of an insulating material different from that of the interlayer insulating layers 120, and may include, e.g., silicon oxide, silicon nitride, or silicon oxynitride.

Figure 2C:
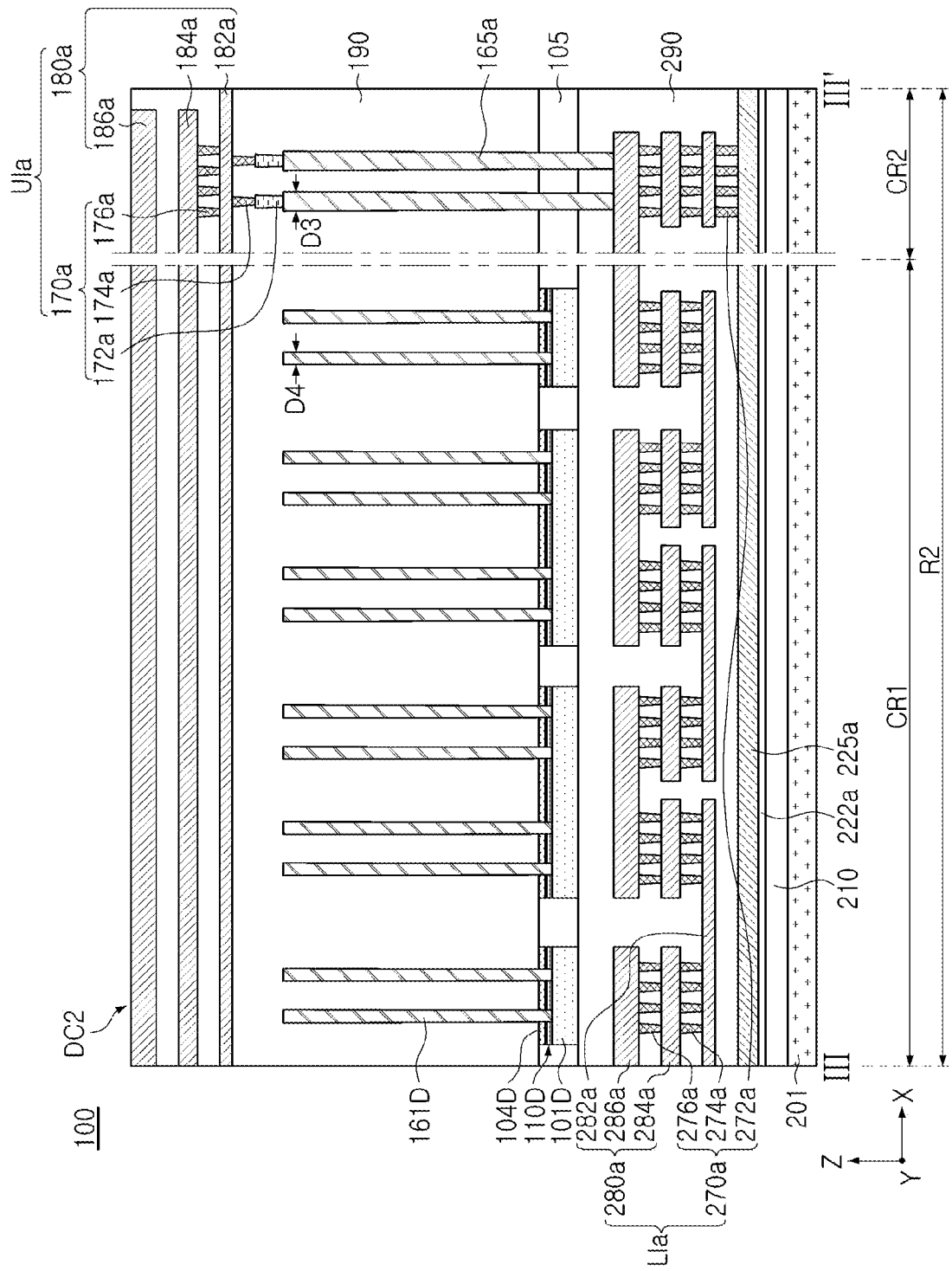

Referring to FIGS. 1B, 2B, and 2C, the first and second defect detectors DC1 and DC2 may be disposed in order (e.g., outwardly) from the first region R1. The first defect detector DC1 may surround at least a portion of the first region R1, and the second defect detector DC2 may surround at least a portion of the first region R1 and the first defect detector DCL. In an implementation, in a plan view, the first detector device DC1 may have a ring (e.g., closed loop) shape or a square ring shape surrounding the entire first region R1, and the second defect detector DC2 may have (e.g., circular) ring shape or a square ring shape surrounding the entire first defect detector DCL.

The first and second defect detectors DC1 and DC2 in the second region R2 may each have a first circuit region CR1 and a second circuit region CR2. The first circuit region CR1 may correspond to an overall region surrounding the first region R1. The second circuit region CR2 may be a relatively narrow region on at least one end of the first circuit region CR1, and power may be applied and detected in the second circuit region CR2. In an implementation, power may be applied to the first and second defect detectors DC1 and DC2 through the first upper interconnection layers 182 in the second circuit region CR2.

The first and second defect detectors DC1 and DC2 may each include a circuit gate dielectric layer 222a, a circuit gate electrode layer 225a, a lower interconnection structure LIa, through vias 165a, and an upper interconnection structure UIa on the substrate 201. The lower interconnection structure LIa may include lower contact plugs 270a including first to third lower contact layers 272a, 274a, and 276a and lower interconnection lines 280a including first to third lower interconnection layers 282a, 284a, and 286a. The upper interconnection structure UIa may include upper contact plugs 170a including first to third upper contact layers 172a, 174a, and 176a and lower interconnection lines 180a including first to third upper interconnection layers 182a, 184a, and 186a. In an implementation, differently from the first region R1, the upper contact plugs 170a may not include an element corresponding to the fourth upper contact layer 178. In an implementation, the upper contact plugs 170a may further include a fourth upper contact plug.

In the first defect detector DC1, the overall conductive elements or the overall conductive layers may be on the first circuit region CR1, and only a portion of the upper interconnection structure UIa may be on the second circuit region CR2. In an implementation, the elements only on the first circuit region CR1 in FIG. 2B may also be on the second circuit region CR2.

In the second defect detector DC2, among the conductive elements, the first lower layer 272a, the through via 165a, and the upper contact plugs 170a may not be on the first circuit region CR1, and the overall conductive elements may be on the second circuit region CR2. In an implementation, the second defect detector DC2 may further include plate layers 101D, a horizontal insulating layer 110D, a second horizontal layer 104D, and plate contacts 161D, on the first circuit region CR1. The plate layers 101D, the horizontal insulating layer 110D, the second horizontal layer 104D, and the plate contacts 161D may be between the lower interconnection structure LIa and the upper interconnection structure UIa, and may be spaced apart from the lower interconnection structure LIa and the upper interconnection structure UIa. The plate layers 101D, the horizontal insulating layer 110D, the second horizontal layer 104D, and the plate contacts 161D may be a dummy pattern, and the plate layers 101D, second horizontal layer 104D, and the plate contacts 161D may be in a floating state. In an implementation, at least a portion of the plate layers 101D, the horizontal insulating layer 110D, the second horizontal layer 104D, and the plate contacts 161D may be omitted.

The elements of the first and second defect detectors DC1 and DC2 may be (e.g., simultaneously) formed together with corresponding elements or layers of the memory cell structure on the first region R1 in the same process, such that the elements may be on substantially the same level and may be formed of the same material. In example embodiments, "corresponding elements" may refer to elements on substantially the same level and formed of the same material. However, in the example embodiments, to distinguish from the corresponding elements of the first region R1, the elements of the second region R2 and the third region R3 are indicated by alphabets in addition to the reference numeral, and in the claims, the terms "first" and "second" may be used to distinguish the elements (and do not imply or require sequential inclusion). Also, in the example embodiments, "substantially the same" indicates that the elements are the same, or that there may be a difference within a range of deviation occurring in a manufacturing process, and the term may be interpreted the same even when the term "substantially" is omitted. As used herein, the term "or" is not an exclusive term, e.g., "A or B" would include A, B, or A and B.

In an implementation, on the first region R1 and the second region R2, elements corresponding to each other may have the same shape or the same size. In an implementation, the lower contact plugs 270a and the line lower interconnection lines 280a of the lower interconnection structure LIa, and the upper contact plugs 170a and the upper interconnection lines 180a of the upper interconnection structure UIa may have substantially the same shape and the same size as those of at least a portion of the corresponding elements of the first region R1.

As illustrated in FIG. 3, on the third lower interconnection layer 286a of the first and second defect detectors DC1 and DC2, the through vias 165a may have a first length L1 in an extension direction of the third lower interconnection layer 286a, e.g., the X direction, and may have a second length L2 smaller than the first length L1 in a direction perpendicular to the extension direction, e.g., in the Y direction. A ratio L1/L2 of the first length L1 to the second length L2 may be about 1.2 or more, e.g., within a range of about 1.2 to about 1.5. If the ratio L1/L2 were to be smaller than the above range, distortion could occur when the through vias 165a are formed, and accordingly, the through vias 165a may not be stably connected to the third lower interconnection layer 286a. The first length L1 may be, e.g., within a range of about 100 nm to about 200 nm, or about 100 nm to about 160 nm. The width W4 of the third lower interconnection layer 286a may be within a range of about 2 times to about 4 times the second length L2.

In an implementation, in the first defect detector DC1, the through vias 165a may have a second dimension D2 greater than a first dimension of the through via 165 of the first region R1 in FIG. 2A in the X direction. In the second defect detector DC2, the through vias 165a may have a third dimension D3, which may be larger than the fourth dimension D4 of the dummy plate contacts 161D. In an implementation, the third dimension D3 may be substantially the same as the second dimension D2. The first to fourth dimensions D1, D2, D3, and D4 may refer to a width on the same level or an average width. In an implementation, the first to fourth dimensions D1, D2, D3, and D4 may have dimensions greater than those of the upper contact plugs 170 and 170a and the lower contact plugs 270 and 270a.

The through vias 165a may have a bar shape having a relatively long length in the extension direction of the third lower interconnection layer 286a in a plan view, such that, when a height of the through vias 165a increases, the through vias 165a may be stably connected to the third lower interconnection layer 286a. In an implementation, the height of the through vias 165a in the Z direction may be about 10 μm or more, and may be varied according to the number of the stacked gate electrodes 130.

The first and second defect detectors DC1 and DC2 may have different ranges of regions for detecting defects. In an implementation, the first defect detector DC1 may be configured to identify an electrical connection relationship between more various types of layers than the second defect detector DC2.

The first defect detector DC1 may be configured to identify an electrical connection relationship between the elements of the first circuit region CR1, e.g., elements between the first upper interconnection layers 182a and the circuit gate electrode layers 225a. In the first defect detector DC1, whether a chipping defect in which a region is cut off between the circuit gate electrode layer 225a, the lower interconnection structure LIa, the through vias 165a, and the upper interconnection structure UIa due to a sawing process has occurred may be identified.

In the first defect detector DC1, a first electrical path connected from the first upper interconnection layers 182a to the circuit gate electrode layers 225a in the Z direction and a second electrical path connected from the circuit gate electrode layers 225a to the first upper interconnection layers 182a in the Z direction may be connected to each other to be alternately disposed. Accordingly, unit structures connected from the first upper interconnection layers 182a to the circuit gate electrode layers 225a in the Z direction may be arranged to be continuously connected in the first circuit region CR1. In the first defect detector DC1, a portion of the first lower contact layers 272a may be configured to be connected to the active regions 205 to perform a grounding function, such that arching may be prevented while the semiconductor device 100 is manufactured.

The second defect detector DC2 may be configured to identify an electrical connection relationship between the elements of the first circuit region CR1, e.g., the elements between the third lower interconnection layers 286a and the first lower interconnection layers 282a. In the second defect detector DC2, whether a chipping defect in which a region between the elements other than the first lower contact layers 272a in the lower interconnection structure LIa is cut off due to a sawing process has occurred may be identified.

In the second defect detector DC2, a first electrical path connected from the third lower interconnection layers 286a to the first lower interconnection layers 282a in the Z direction and a second electrical path connected from the first lower interconnection layers 282a to the third lower interconnection layers 286a in the Z direction may be connected to each other and alternately repeated. Accordingly, on the first circuit region CR1, unit structures connected from the third lower interconnection layers 286a to the first lower interconnection layers 282a in the Z direction may be arranged to be continuously connected to each other. In an implementation, first lower contact layers 272a may be further disposed on the first circuit region CR1 of the second defect detector DC2. In this case, the electrical connection relationship between the elements between the third lower interconnection layers 286a and the circuit gate electrode layer 225a may be identified.

Figure 2D:
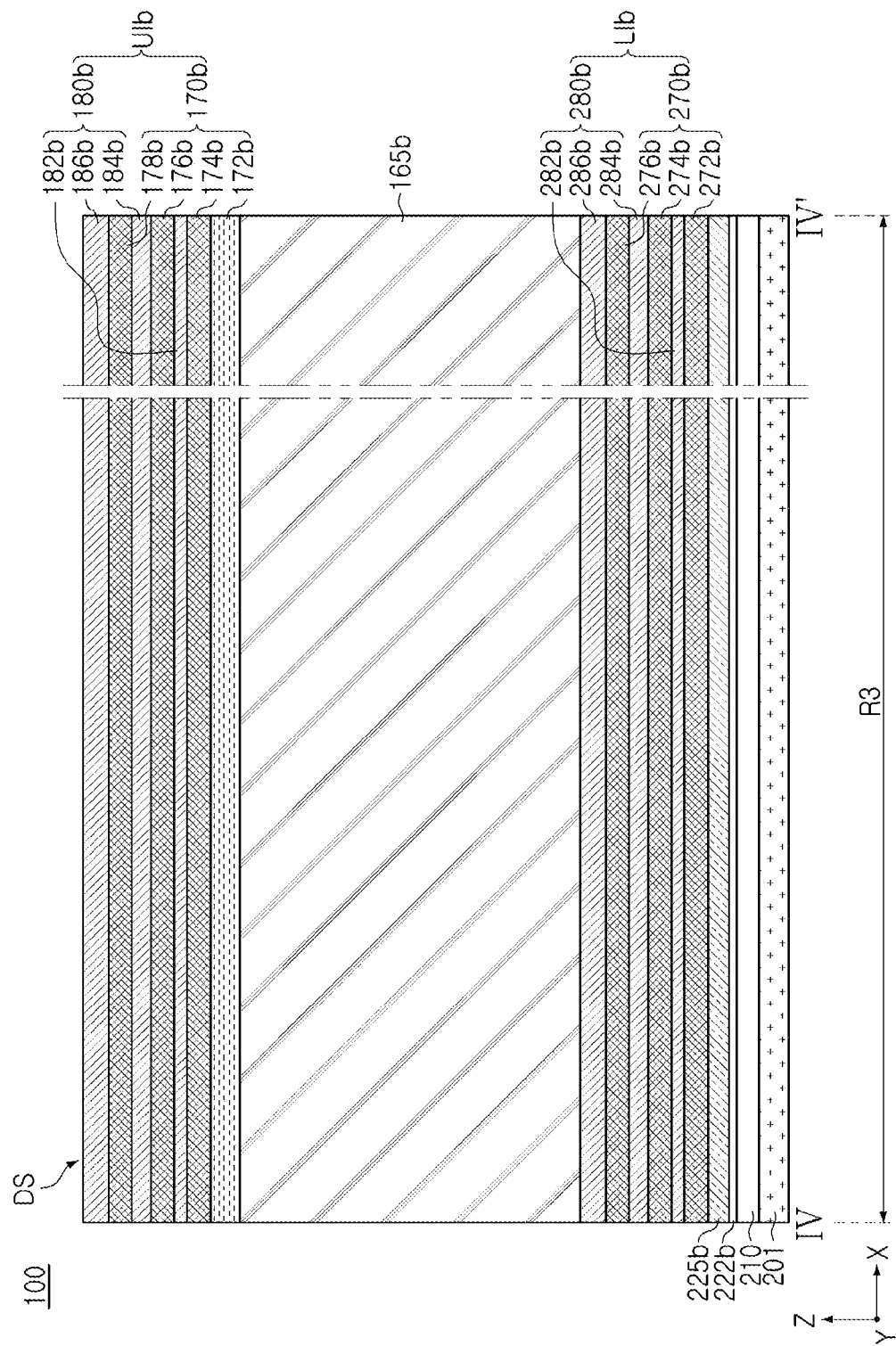

Referring to FIG. 2D, the dam structure DS may include a circuit gate dielectric layer 222b, a circuit gate electrode layer 225b, a lower interconnection structure LIb, through vias 165b, and an upper interconnection structure UIb, on a substrate 201. The lower interconnection structure LIb may include lower contact plugs 270b including the first to third lower contact layers 272b, 274b, and 276b and lower interconnection lines 280b including the first to third lower interconnection layers 282b, 284b, and 286b. The second interconnection structure UIb may include upper contact plugs 170b including first to fourth upper contact layers 172b, 174b, 176b, and 178b, and lower interconnection lines 180b including first to third upper interconnection layers 182b, 184b, and 186b. In an implementation, in the dam structure DS, one or more layers may be omitted from an uppermost portion.

Each of the layers of the dam structure DS may be arranged in a linear form extending along a circumference of the second region R2 regardless of shapes of corresponding elements of the first region R1. The dam structure DS may have a linear shape in which a plurality of layers, conductive layers, e.g., are stacked, such that the dam structure DS may protect the memory structure of the first region R1 and the first and second defect detectors DC1 and DC2 of the second region R2 from contamination from the outside in the process of manufacturing the semiconductor device 100 including the sawing process.

Figure 2E:
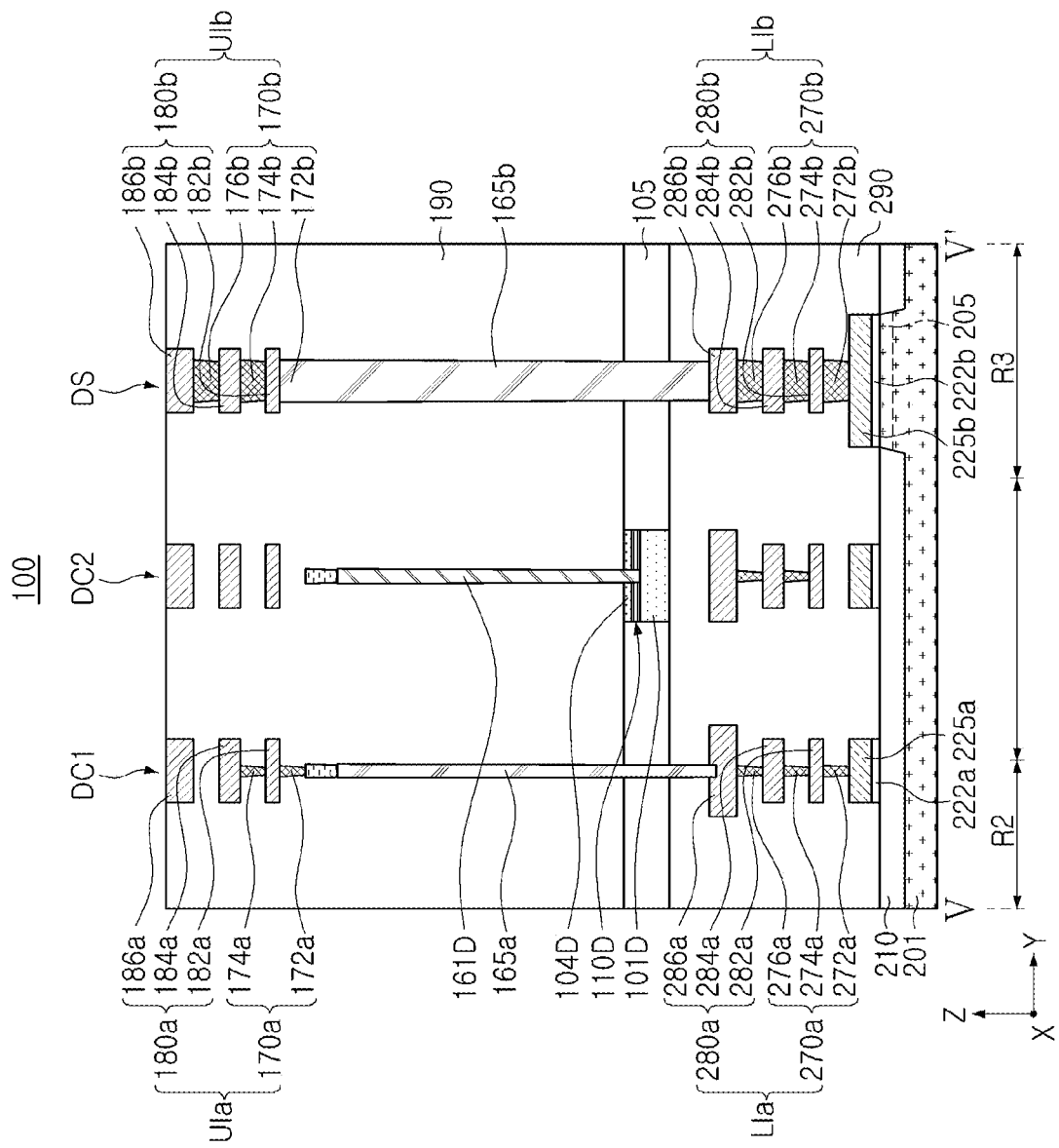

Referring to FIG. 2E, in a region perpendicular to the extension direction of the second region R2 and the third region R3, the first defect detector DC1, the second defect detector DC2, and the dam structures DS may be physically and electrically spaced apart from each other.

As illustrated in FIGS. 1B and 2E, in the first and second defect detectors DC1 and DC2, widths of the upper interconnection lines 180a and the lower interconnection lines 280a may be the same or similar to each other in the Y direction. In an implementation, the third lower interconnection layers 286a may have a relatively wide width (e.g., relative to other elements).

In the dam structure DS, widths of the upper interconnection lines 180b and the lower interconnection lines 280b may be the same or similar to each other, and may be the same as or similar to the widths W1 and W2 of the first and second defect detectors DC1 and DC2. The widths W1, W2, and W3 may range from, e.g., about 0.1 μm to about 0.5 μm. In an implementation, the upper contact plugs 170b and the lower contact plugs 270b may have a width smaller than the width W3 of the upper interconnection lines 180b and the lower interconnection lines 280b.

Figure 4A:
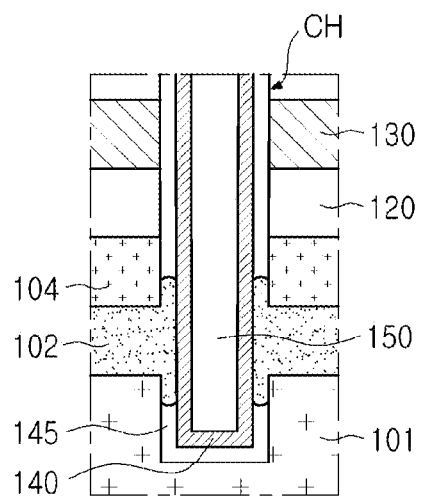
FIGS. 4A and 4B are enlarged views of a portion of a semiconductor device according to an example embodiment of the present disclosure.
Figure 4B:
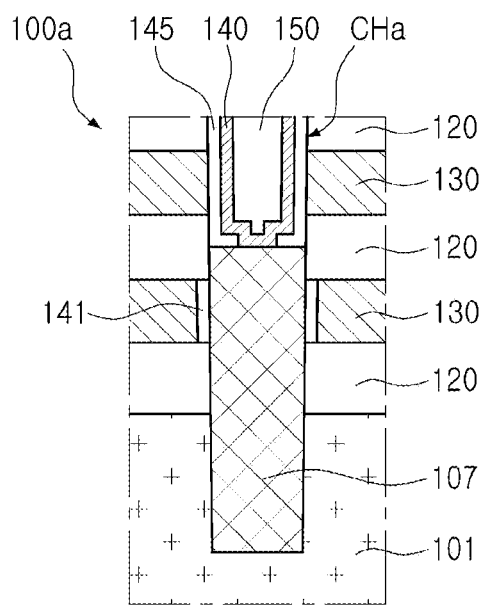

FIGS. 4A and 4B are enlarged views of a portion of a semiconductor device according to an example embodiment. FIG. 4A is an enlarged view of region "B" in FIG. 2A, and FIG. 4B is an enlarged view of a region corresponding to the region "B."

Referring to FIG. 4A, the channel layer 140 may be in the channel structures CH. In the channel structures CH, the channel layer 140 may be formed in an annular shape surrounding a channel filling insulating layer 150 therein. In an implementation, the channel layer 140 may have a columnar shape such as a cylindrical shape or a prism shape without the channel filling insulating layer 150. The channel layer 140 may be connected to the first horizontal layer 102 in a lower portion. The channel layer 140 may include a semiconductor material such as polycrystalline silicon or single crystal silicon.

The gate dielectric layer 145 may be between the gate electrodes 130 and the channel layer 140. In an implementation, the gate dielectric layer 145 may include a tunneling layer, a charge storage layer, and a blocking layer stacked in order from the channel layer 140. The tunneling layer may tunnel charges into the charge storage layer, and may include, e.g., silicon oxide ($SiO_2$), silicon nitride ($Si_3N_4$), silicon oxynitride (SiON), or a combination thereof. The charge storage layer may be a charge trap layer or a floating gate conductive layer. The blocking layer may include silicon oxide ($SiO_2$), silicon nitride ($Si_3N_4$), silicon oxynitride (SiON), a high-k dielectric material, or a combination thereof. In an implementation, at least a portion of the gate dielectric layer 145 may extend in a horizontal direction along the gate electrodes 130.

Referring to FIG. 4B, in the semiconductor device 100*a*, the memory cell region CELL may not include first and second horizontal layers 102 on the plate layer 101, differently from the example embodiment in FIG. 2A. Also, the channel structure CHa may further include an epitaxial layer 107.

The epitaxial layer 107 may be on the plate layer 101 on a lower end of the channel structure CHa, and may be on a side surface of the at least one gate electrode 130. The epitaxial layer 107 may be in a recess region of the plate layer 101. In an implementation, a level of a lower surface of the epitaxial layer 107 may be higher than a level of an upper surface of the lowermost gate electrode 130 and may be lower than a level of the lower surface of the upper gate electrode 130. The epitaxial layer 107 may be connected to the channel layer 140 through an upper surface. A gate insulating layer 141 may be further disposed between the epitaxial layer 107 and the gate electrode 130 in contact with the epitaxial layer 107.

Figure 5A:
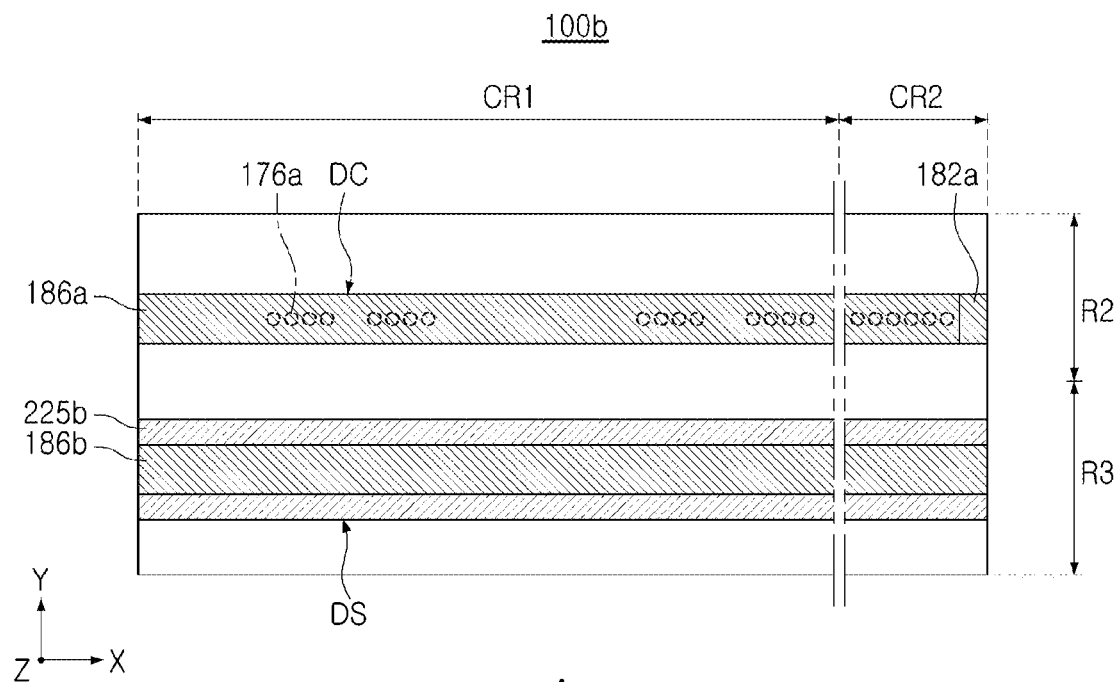
FIGS. 5A and 5B are plan views of a semiconductor device according to an example embodiment of the present disclosure.
Figure 5B:
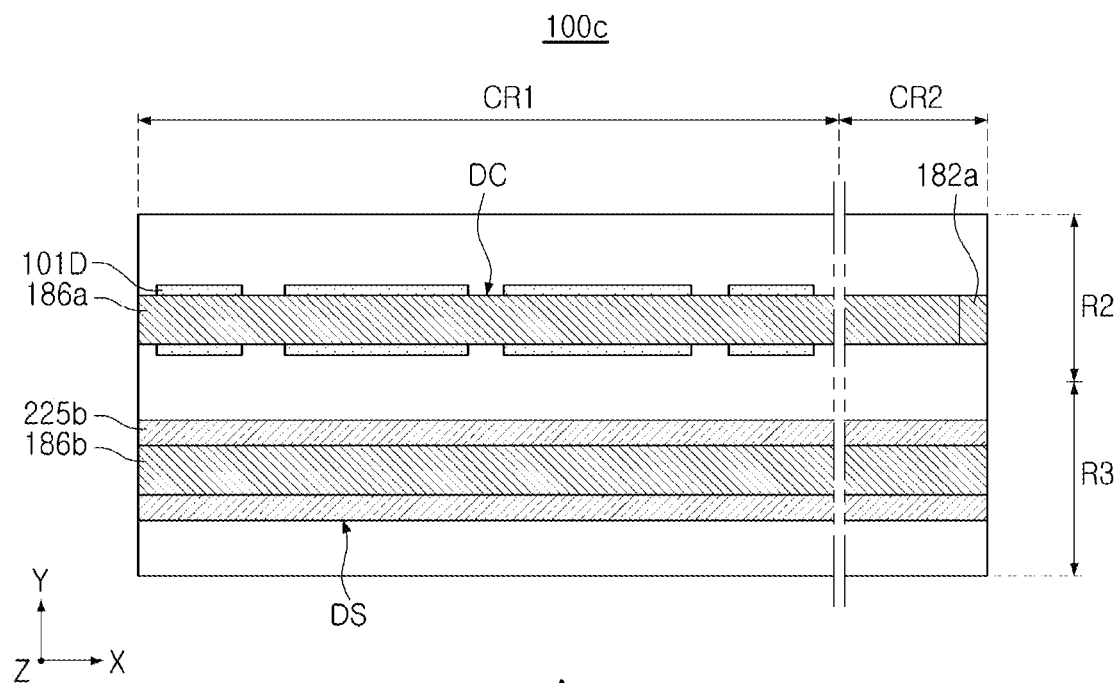

FIGS. 5A and 5B are plan views of a semiconductor device according to an example embodiment, illustrating a region corresponding to FIG. 1B.

Referring to FIG. 5A, a semiconductor device 100*b* may only include a single defect detector DC corresponding to the first defect detector DC1 of FIG. 1B on the second region R2, differently from the example embodiment in FIG. 1B. In this case, the width of the second region R2 in the extension direction may be reduced, such that the size of the second region R2 may be reduced.

Referring to FIG. 5B, a semiconductor device 100*c* may only include a single defect detector DC corresponding to the second defect detector DC2 of FIG. 1B on the second region R2, differently from the example embodiment in FIG. 1B. In this case, the width of the second region R2 in the extension direction may be reduced, such that the size of the second region R2 may be reduced.

As described above, in example embodiments, the number and the type of the defect detectors DC on the second region R2 may be varied.

Figure 6:
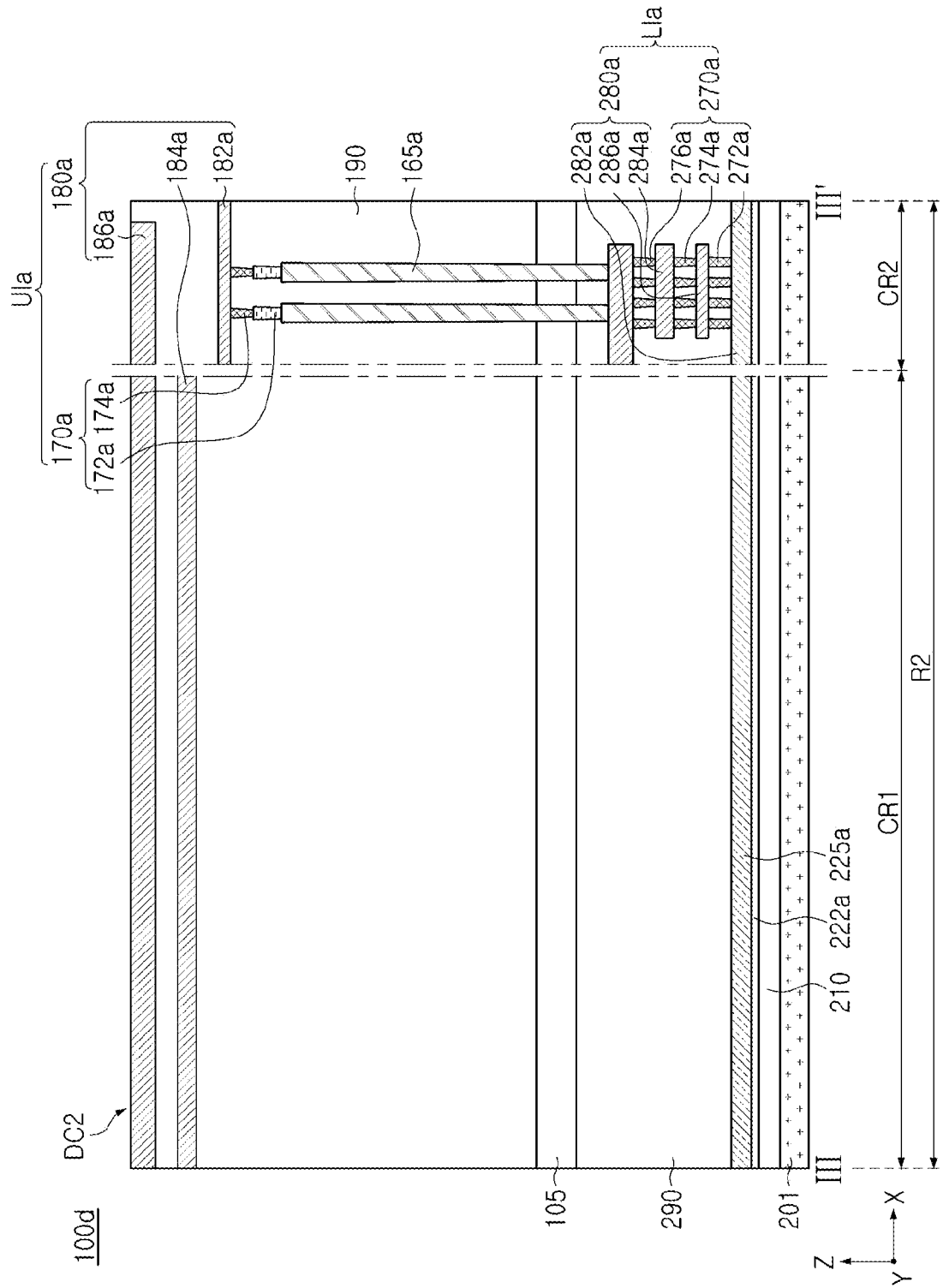
FIG. 6 is a cross-sectional view of a semiconductor device according to an example embodiment of the present disclosure.

FIG. 6 is a cross-sectional view of a semiconductor device according to an example embodiment, illustrating a region corresponding to FIG. 2C.

Referring to FIG. 6, in a semiconductor device 100*d*, the structure of the first circuit region CR1 of the second defect detector DC2 may be different from the example embodiment of FIG. 2C. Only at least a portion of the circuit gate electrode layer 225*a* and the upper interconnection lines 180*a* among the conductive elements may be on the first circuit region CR1. Also, differently from the example embodiment of FIG. 2C, the second circuit region CR2 may not include the second upper interconnection layer 184*a* and the third upper contact layers 176*a*. In an implementation, the arrangement of elements on the first upper interconnection layer 182*a* in the second circuit region CR2 may be varied.

Accordingly, the second defect detector DC2 may have an electrical path extending along the circuit gate electrode layer 225*a*, and may identify whether the circuit gate electrode layer 225*a* is disconnected.

In an implementation, the structure of the second defect detector DC2 may be varied within a range in which the number of conductive elements stacked along the Z direction is smaller than the number of those of the first defect detector DC1 of FIG. 2B. Accordingly, the second defect detector DC2 may identify an electrical connection relationship between a portion of the conductive elements, rather than the entire conductive elements, in various manners.

FIGS. 7A to 11B are cross-sectional views of stages in a method of manufacturing a semiconductor device according to an example embodiment. FIGS. 7A, 8A, 9, 10, and 11A illustrate regions corresponding to the region in FIG. 2A, and FIGS. 7B, 8B, and 11B illustrate regions corresponding to the region in FIG. 2B.

Figure 7A:
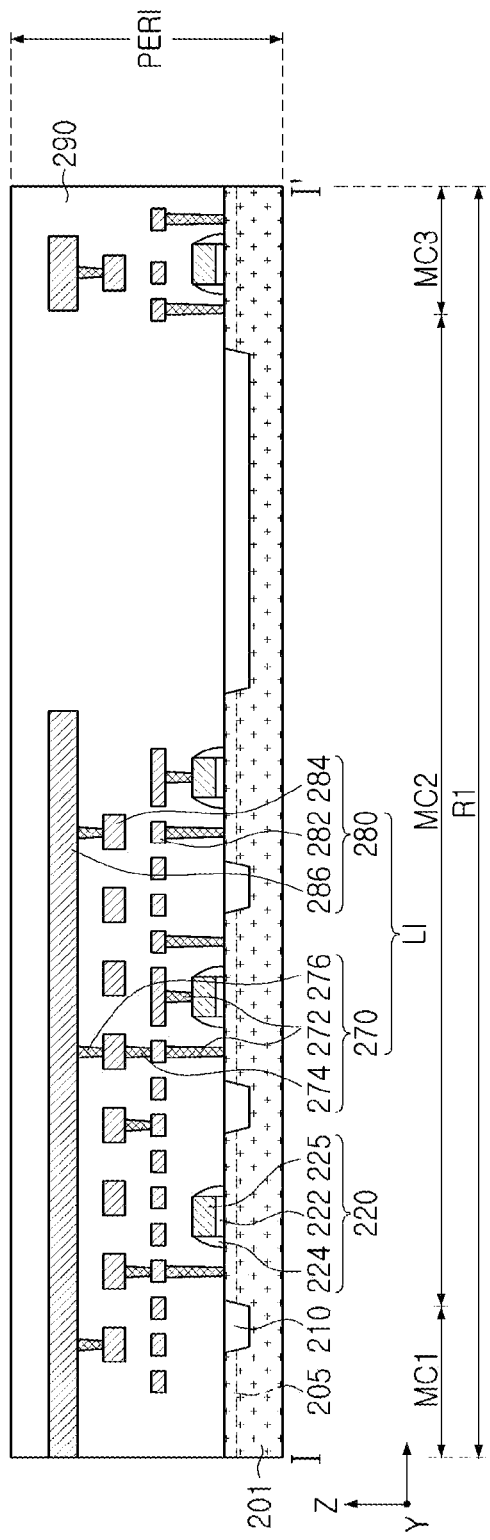
FIGS. 7A to 11B are cross-sectional views of stages in a method of manufacturing a semiconductor device according to an example embodiment of the present disclosure.
Figure 7B:
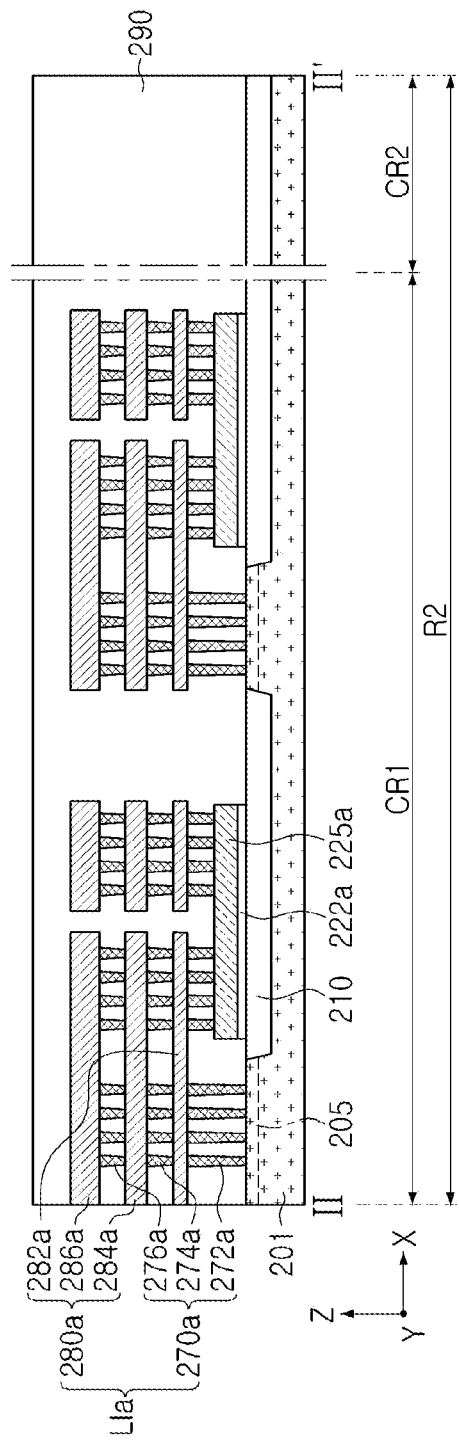

Referring to FIGS. 7A and 7B, driving circuits 220, lower interconnection structure LI, and a peripheral region insulating layer 290, forming a peripheral circuit region PERI, may be on a first region R1 of a substrate 201. Accordingly, on a second region R2, a circuit gate dielectric layer 222*a*, a circuit gate electrode layer 225*a*, a lower interconnection structure LIa, and the peripheral region insulating layer 290 may be formed.

Device isolation layers 210 may be formed in the substrate 201 and may define an active region 205. The device isolation layers 210 may be formed by, e.g., a shallow trench isolation (STI) process.

Circuit gate dielectric layers 222 and 222*a* and circuit gate electrode layers 225 and 225*a* may be formed in order on the substrate 201. The circuit gate dielectric layers 222 and 222*a* and the circuit gate electrode layers 225 and 225*a* may be formed using atomic layer deposition (ALD) or chemical vapor deposition (CVD). In an implementation, the circuit gate dielectric layers 222 and 222*a* may be formed of silicon oxide, and the circuit gate electrode layers 225 and 225*a* may be formed of polycrystalline silicon or metal silicide layers. Thereafter, spacer layers 224 may be formed on both sidewalls of the circuit gate dielectric layer 222 and the circuit gate electrode layer 225. In an implementation, the spacer layer 224 may include a plurality of layers. Thereafter, an ion implantation process may be performed to form source/drain regions in the active region 205. In an implementation, the spacer layers 224 may be further formed on both sidewalls of the circuit gate dielectric layer 222*a* and the circuit gate electrode layer 225*a* in the second region R2.

The lower contact plugs 270 and 270*a* of the first interconnection structures LI and LIa may be formed by forming a portion of a peripheral region insulating layer 290, partially removing the layer by etching, and filling a conductive material therein. The lower interconnection lines 280 and 280*a* may be formed by, e.g., depositing a conductive material and patterning the material. The peripheral region insulating layer 290 may include a plurality of insulating layers. A portion of the peripheral region insulating layer 290 may be formed in each process of forming the first interconnection structures LI and LIa. Accordingly, the entire peripheral circuit region PERI may be formed in the first region R1.

Hereinafter, corresponding elements may be formed in the region of the second region R2 including the second defect detector DC2 (see FIG. 2C), and in the third region R3 (see FIG. 2D), unless otherwise indicated.

Figure 8A:
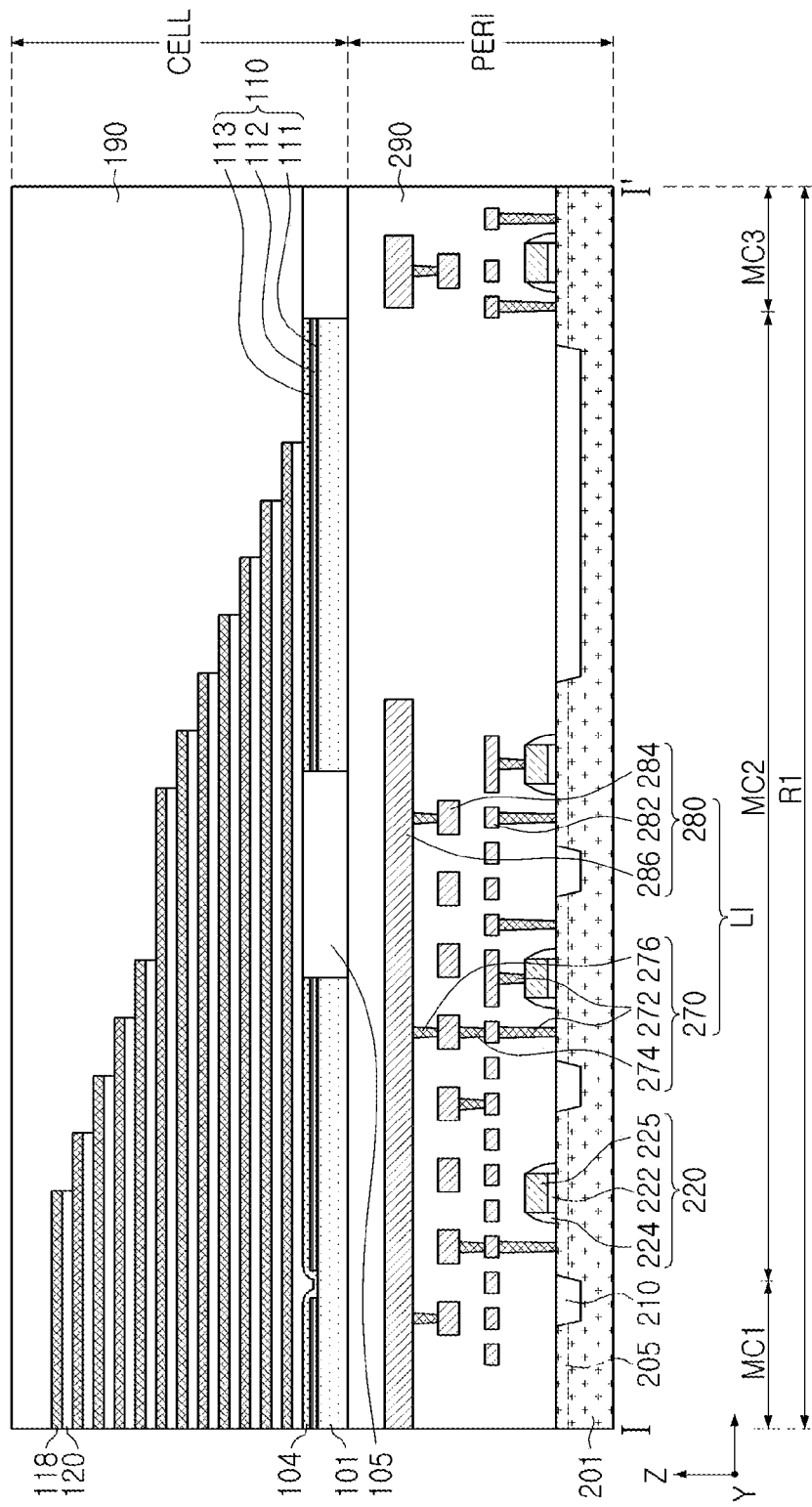
Figure 8B:
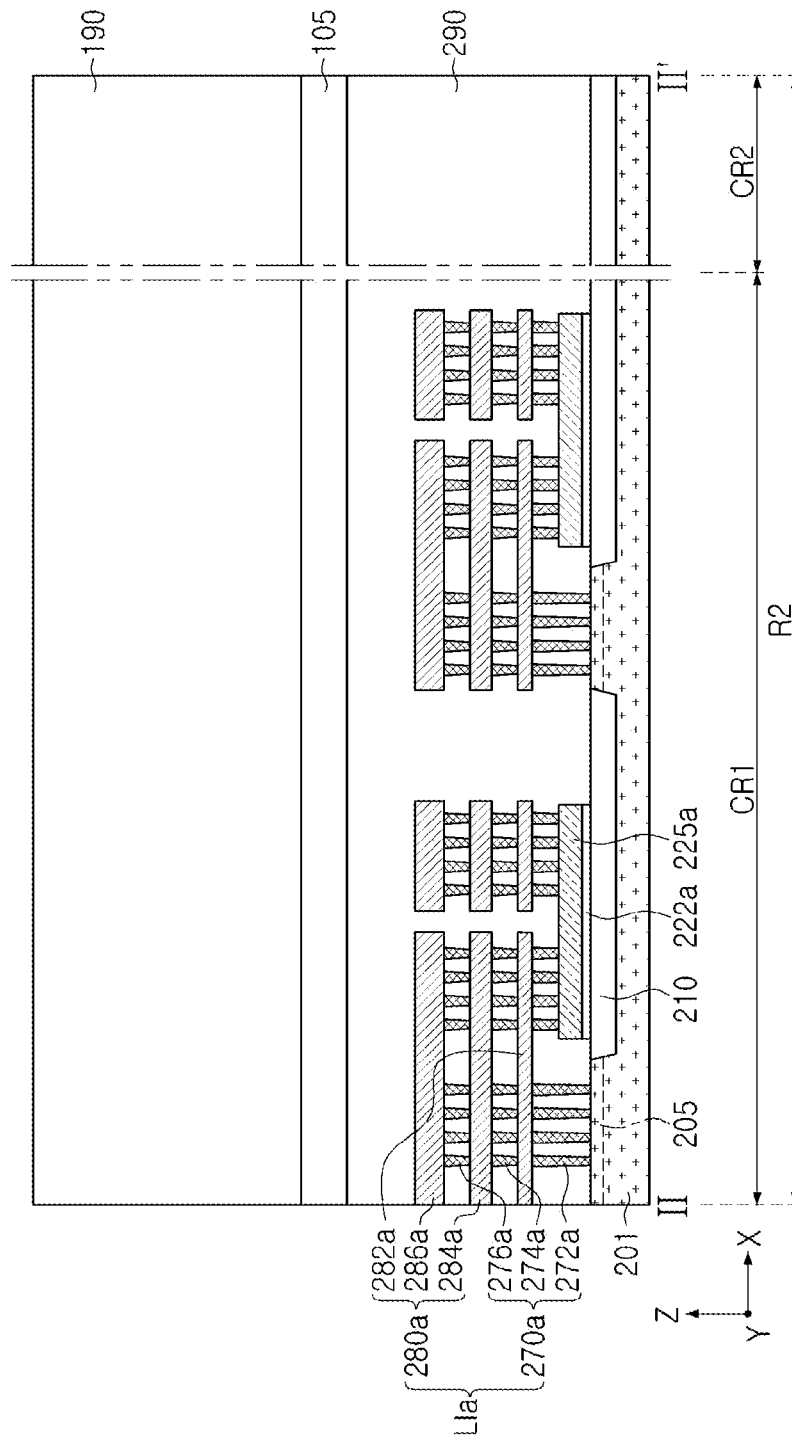

Referring to FIGS. 8A and 8B, on the first region R1, the plate layer 101 of the memory cell region CELL, the horizontal insulating layer 110, the second horizontal layer 104, and the substrate insulating layer 105 may be formed on the peripheral circuit region PERI, the sacrificial insulating layers 118 and the interlayer insulating layers 120 may be alternately stacked, and the cell region insulating layer 190 may be formed. Accordingly, on the second region R2, the substrate insulating layer 105 and the cell region insulating layer 190 may be formed.

The plate layer 101 may be formed of, e.g., polycrystalline silicon, and may be formed by a CVD process. The horizontal insulating layer 110 may be formed by stacking the first to third horizontal insulating layers 111, 112, and 113 in order on the plate layer 101. The first to third horizontal insulating layers 111, 112, and 113 may be replaced with the first horizontal layer 102 in FIG. 2A formed through a subsequent process in the first region R1. The second horizontal layer 104 may be formed on the third horizontal insulating layer 113.

The substrate insulating layer 105 may be formed by removing a portion of the second horizontal layer 104, the horizontal insulating layer 110, and the plate layer 101 from an upper portion and filling an insulating material therein in a region in which the second through interconnection region TV2 (see FIG. 2A) is disposed and on an external side of the memory cell arrays MCA (see FIG. 1A).

A portion of the sacrificial insulating layers 118 may be replaced with the gate electrodes 130 (see FIG. 2A) through a subsequent process. The sacrificial insulating layers 118 may be formed of a material different from that of the interlayer insulating layers 120. In an implementation, the interlayer insulating layer 120 may be formed of silicon oxide or silicon nitride, and the sacrificial insulating layers 118 may be formed of a material different from a material of an interlayer insulating layer 120, e.g., silicon, silicon oxide, silicon carbide, or silicon nitride. In an implementation, thicknesses of the interlayer insulating layers 120 and the sacrificial insulating layers 118 and the number of films forming the interlayer insulating layers 120 and the sacrificial insulating layers 118 may be varied from the example in the drawings.

A photolithography process and an etching process may be repeatedly performed on the sacrificial insulating layers 118 using a mask layer such that upper sacrificial insulating layers 118 may extend shorter than lower sacrificial insulating layers 118 on the first region R1. Accordingly, the sacrificial insulating layers 118 may form a stepped structure formed in a staircase shape by a predetermined unit. Thereafter, a cell region insulating layer 190 covering the stack structure of the sacrificial insulating layers 118 and the interlayer insulating layers 120 may be formed.

In this process, in the region of the second region R2 including the second defect detector DC2 (see FIG. 2C), a plate layer 101D, a horizontal insulating layer 110D, and a second horizontal layer 104D may be formed in parallel to the substrate insulating layer 105.

Figure 9:
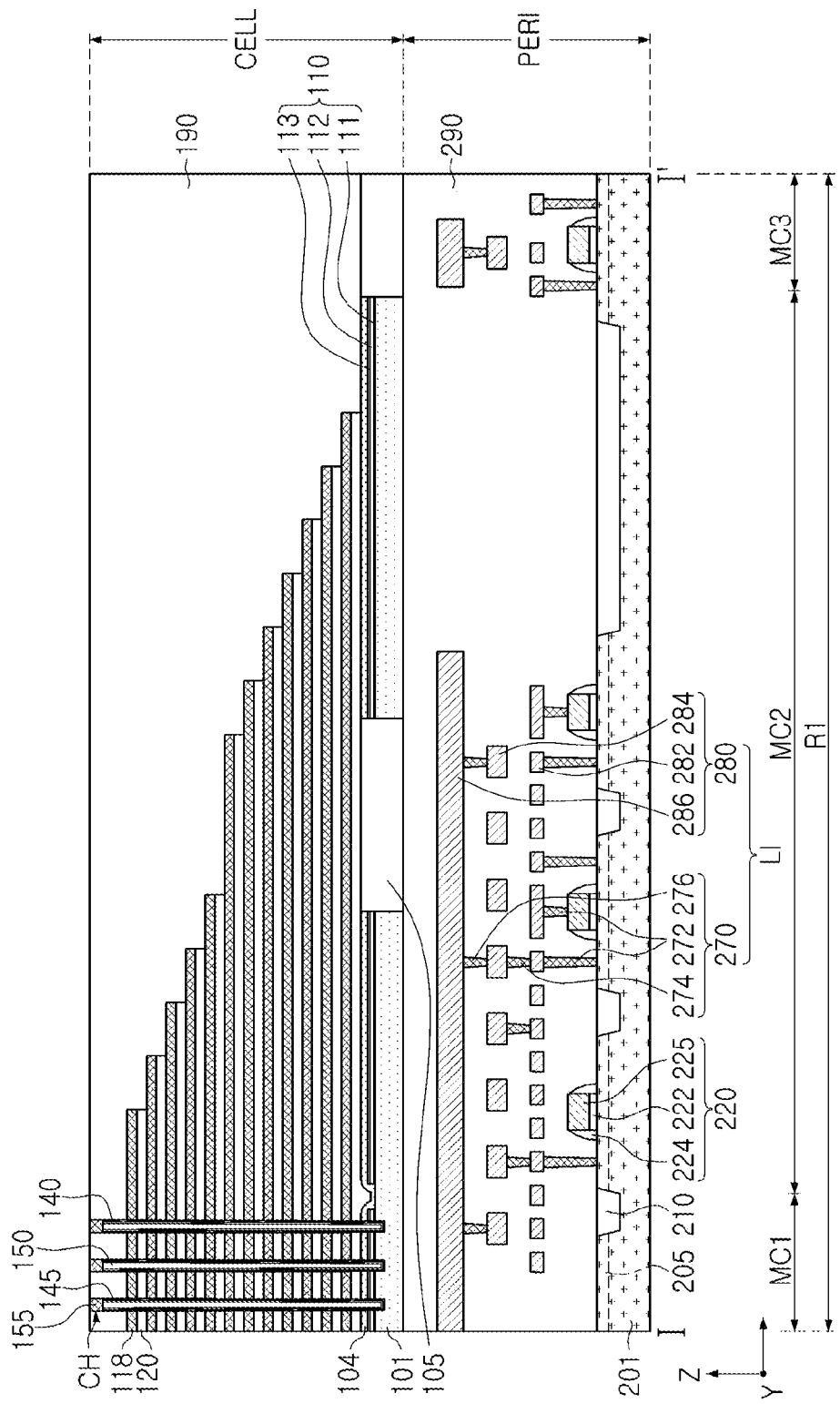

Referring to FIG. 9, channel structures CH penetrating the stack structure of the sacrificial insulating layers 118 and the interlayer insulating layers 120 may be formed in the first region R1.

The channel structures CH may be formed by anisotropically etching the sacrificial insulating layers 118 and the interlayer insulating layers 120 using a mask layer, and may be formed by forming hole-shaped channel holes and filling the holes. Due to the height of the stack structure, sidewalls of the channel structures CH may not be perpendicular to an upper surface of the plate layer 101. The channel structures CH may be recessed into a portion of the plate layer 101.

At least a portion of the gate dielectric layer 145, the channel layer 140, the channel filling insulating layer 150, and the channel pad 155 may be formed in order in the channel structures CH. The gate dielectric layer 145 may be formed to have a uniform thickness using an ALD or CVD process. In this process, the entire gate dielectric layer 145 or a portion of the dielectric layer 145 may be formed, and a portion extending perpendicularly to the plate layer 101 along the channel structures CH may be formed in this process. The channel layer 140 may be formed on the gate dielectric layer 145 in the channel structures CH. The channel filling insulating layer 150 may be configured to fill the channel structures CH, and may be an insulating material. The channel pad 155 may be formed of a conductive material, e.g., polycrystalline silicon.

Figure 10:
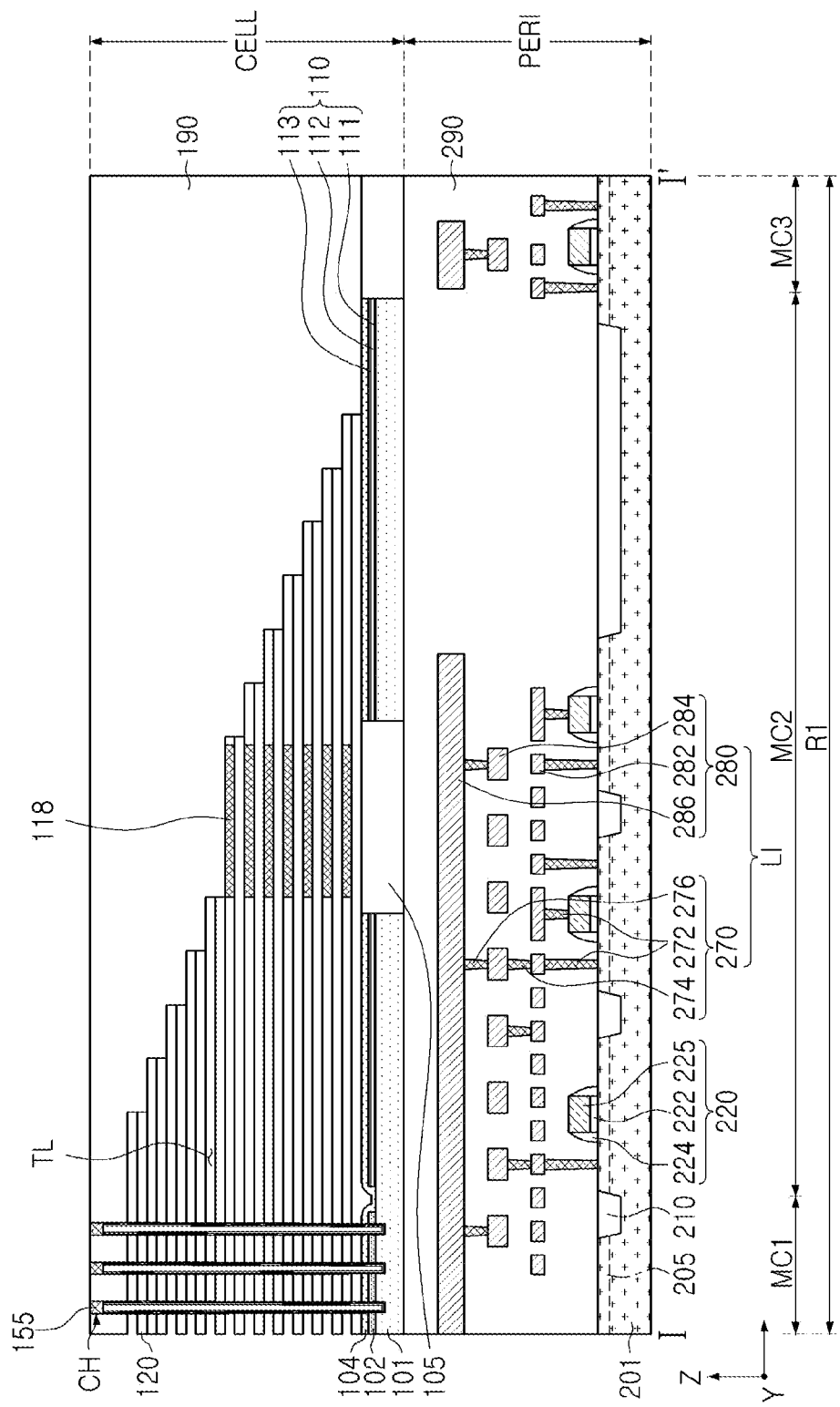

Referring to FIG. 10, in the first region R1, by removing a portion of the sacrificial insulating layers 118, the tunnel portions TL may be formed.

In a region of the first region R1, openings penetrating the sacrificial insulating layers 118 and the interlayer insulating layers 120 and penetrating the second horizontal layer 104 in a lower portion may be formed. Thereafter, the second horizontal insulating layer 112 may be exposed by an etch-back process while sacrificial spacer layers are formed in the openings. The second horizontal insulating layer 112 may be selectively removed from the exposed region on the first cell region MC1, and the upper and lower first and third horizontal insulating layers 111 and 113 may be removed.

The horizontal insulating layer 110 may be removed by, e.g., a wet etching process. In the process of removing the first and third horizontal insulating layers 111 and 113, a portion of the gate dielectric layer 145 exposed in the region from which the second horizontal insulating layer 112 is removed may also be removed. The first horizontal layer 102 may be formed by depositing a conductive material in the region from which the horizontal insulating layer 110 is removed, and the sacrificial spacer layers may be removed in the openings. Through this process, the first horizontal layer 102 may be formed on the first cell region MC1, and the horizontal insulating layer 110 may remain on the second cell region MC2.

The sacrificial insulating layers 118 may be removed from an external side of the second through interconnection region TV2 (see FIG. 2A). The sacrificial insulating layers 118 may remain in the second through interconnection region TV2 and may form an insulating region of the second through interconnection region TV2 together with the interlayer insulating layers 120. The sacrificial insulating layers 118 may be selectively removed with respect to the interlayer insulating layers 120 using, e.g., wet etching. Accordingly, a plurality of tunnel portions TL may be formed between the interlayer insulating layers 120. The region in which the second through interconnection region TV2 is to be formed may be spaced apart from the openings such that an etchant may not reach, and accordingly, the sacrificial insulating layers 118 may remain in the region.

Figure 11A:
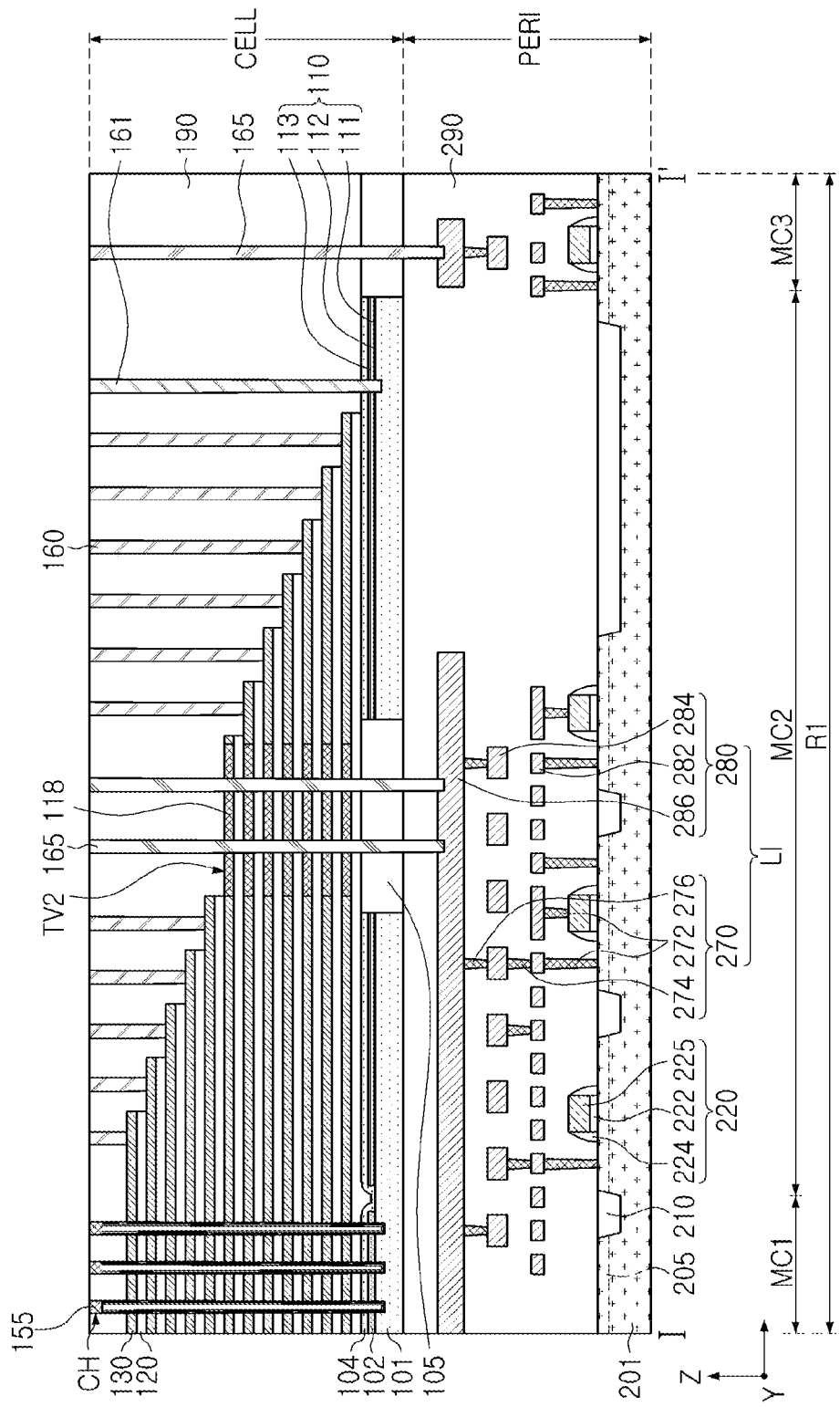
Figure 11B:
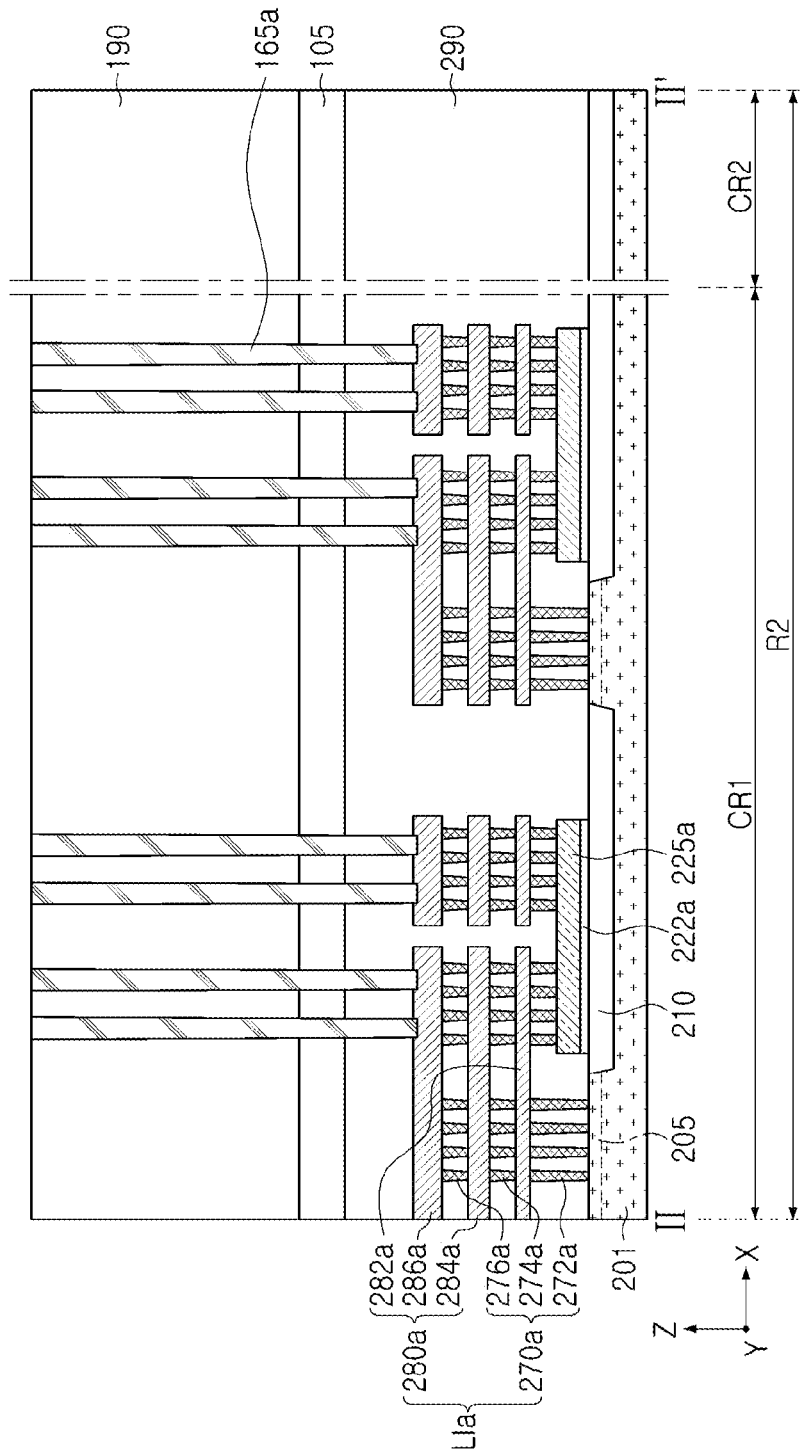

Referring to FIGS. 11A and 11B, on the first region R1, the gate electrodes 130 may be formed by filling the tunnel portions TL from which the sacrificial insulating layers 118 are partially removed with a conductive material, and the gate contacts 160, the plate contact 161, and the through vias 165 may be formed. Accordingly, through vias 165*a* may be formed in the second region R2.

The conductive material forming the gate electrodes 130 may fill the tunnel portions TL. Side surfaces of the gate electrodes 130 may be in contact with side surfaces of the sacrificial insulating layers 118 of the second through interconnection region TV2. The conductive material may include, e.g., a metal, polycrystalline silicon, or a metal silicide material.

The gate contacts 160 may be connected to the gate electrodes 130 on the second cell region MC2 of the first region R1, and the plate contact 161 may be connected to the plate layer 101 on an end of the second cell region MC2. The through vias 165 and 165*a* may be connected to the first interconnection structures LI and LIa on the second through interconnection region TV2 and the third cell region MC3 of the first region R1, and on the second region R2. On the second region R2, the through vias 165*a* may be formed in a bar shape along an extending direction of the lower third lower interconnection layer 286*a*.

In an implementation, the gate contacts 160, the plate contact 161, and the through vias 165 and 165*a* may be formed to have different depths, and the elements may be formed by forming contact holes simultaneously using an etch stop layer and filling the contact hole with a conductive material. In an implementation, a portion of the gate contacts 160, the plate contact 161, and the through vias 165 and 165*a* may be formed in different processes.

In this process, on the region of the second region R2 including the second defect detector DC2 (see FIG. 2C), the plate contacts 161D connected to the plate layer 101D may be formed along with the plate contact 161 of the first region R1.

Thereafter, referring back to FIGS. 2A and 2B, upper interconnection structures UI and UIa may be formed.

The upper contact plugs 170 and 170*a* of the upper interconnection structures UI and UIa may be formed by forming a portion of the cell region insulating layer 190, partially removing the layer by etching, and filling the conductive material. The upper interconnection lines 180 and 180*a* may be formed by depositing a conductive material and patterning the material, for example.

Accordingly, the semiconductor device 100 in FIGS. 1A to 3 may be manufactured.

Figure 12:
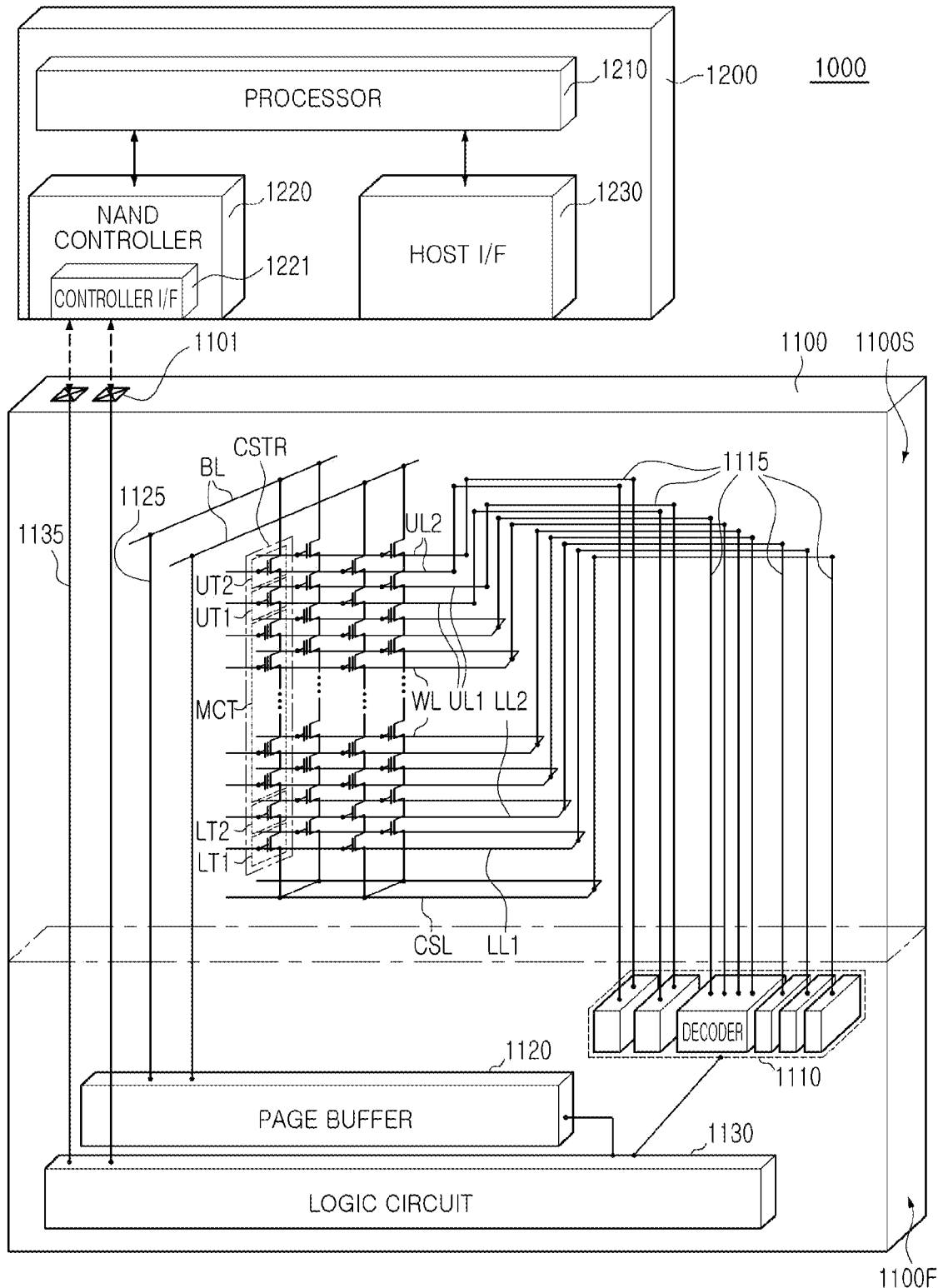
FIG. 12 is a view of a data storage system including a semiconductor device according to an example embodiment of the present disclosure.

FIG. 12 is a view of a data storage system including a semiconductor device according to an example embodiment.

Referring to FIG. 12, a data storage system 1000 may include a semiconductor device 1100 and a controller 1200 electrically connected to the semiconductor device 1100. The data storage system 1000 may be implemented as a storage device including one or a plurality of semiconductor devices 1100 or an electronic device including a storage device. In an implementation, the data storage system 1000 may be implemented as a solid state drive device (SSD) device, a universal serial bus (USB), a computing system, a medical device, or a communication device, including one or a plurality of semiconductor devices 1100.

In an implementation, the semiconductor device 1100 may be implemented as a nonvolatile memory device, and may be implemented as the NAND flash memory device described with reference to FIGS. 1 to 6. The semiconductor device 1100 may include a first semiconductor structure 1100F and a second semiconductor structure 1100S on the first semiconductor structure 1100F. In an implementation, the first semiconductor structure 1100F may be on the side of the second semiconductor structure 1100S. The first semiconductor structure 1100F may be a peripheral circuit structure including a decoder circuit 1110, a page buffer 1120, and a logic circuit 1130. The second semiconductor structure 1100S may be a memory cell structure including a bit line BL, a common source line CSL, word lines WL, first and second gate upper lines UL1 and UL2, first and second gate lower lines LL1 and LL2, and memory cell strings CSTR between the bit line BL and the common source line CSL.

In the second semiconductor structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT between the lower transistors LT1 and LT2 and the upper transistors UT1 and UT2. The number of the lower transistors LT1 and LT2 and the number of the upper transistors UT1 and UT2 may be varied in example embodiments.

In an implementation, the upper transistors UT1 and UT2 may include a string select transistor, and the lower transistors LT1 and LT2 may include a ground select transistor. The gate lower lines LL1 and LL2 may be gate electrodes of the lower transistors LT1 and LT2, respectively. The word lines WL may be gate electrodes of the memory cell transistors MCT, and the gate upper lines UL1 and UL2 may be gate electrodes of the upper transistors UT1 and UT2, respectively.

In an implementation, the lower transistors LT1 and LT2 may include a lower erase control transistor LT1 and a ground select transistor LT2 connected to each other in series. The upper transistors UT1 and UT2 may include a string select transistor UT1 and an upper erase control transistor UT2 connected to each other in series. At least one of the lower erase control transistor LT1 and the upper erase control transistor UT1 may be used for an erase operation of erasing data stored in the memory cell transistors MCT using a GIDL phenomenon.

The common source line CSL, the first and second gate lower lines LL1 and LL2, the word lines WL, and the first and second gate upper lines UL1 and UL2 may be electrically connected to the decoder circuit 1110 through first connection interconnections 1115 extending from the semiconductor structure 1100F to the second semiconductor structure 1100S. The bit lines BL may be electrically connected to the page buffer 1120 through second connection interconnections 1125 extending from the first semiconductor structure 1100F to the second semiconductor structure 1100S.

In the first semiconductor structure 1100F, the decoder circuit 1110 and the page buffer 1120 may perform a control operation on at least one selected memory cell transistor among the plurality of memory cell transistors MCT. The decoder circuit 1110 and the page buffer 1120 may be controlled by the logic circuit 1130. The semiconductor device 1100 may communicate with the controller 1200 through an input and output pad 1101 electrically connected to the logic circuit 1130. The input and output pad 1101 may be electrically connected to the logic circuit 1130 through an input and output connection interconnection 1135 extending from the first semiconductor structure 1100F to the second semiconductor structure 1100S.

The controller 1200 may include a processor 1210, a NAND controller 1220, and a host interface 1230. In an implementation, the data storage system 1000 may include a plurality of semiconductor devices 1100, and in this case, the controller 1200 may control the plurality of semiconductor devices 1100.

The processor 1210 may control overall operation of the data storage system 1000 including the controller 1200. The processor 1210 may operate according to a predetermined firmware, and may access the semiconductor device 1100 by controlling the NAND controller 1220. The NAND controller 1220 may include a NAND interface 1221 for processing communication with the semiconductor device 1100. Control commands for controlling the semiconductor device 1100, data to be written in the memory cell transistors MCT of the semiconductor device 1100, and data to be read from the memory cell transistors MCT of the semiconductor device 1100 may be transmitted through the NAND interface 1221. The host interface 1230 may provide a communication function between the data storage system 1000 and an external host. When a control command is received from an external host through the host interface 1230, the processor 1210 may control the semiconductor device 1100 in response to the control command.

Figure 13:
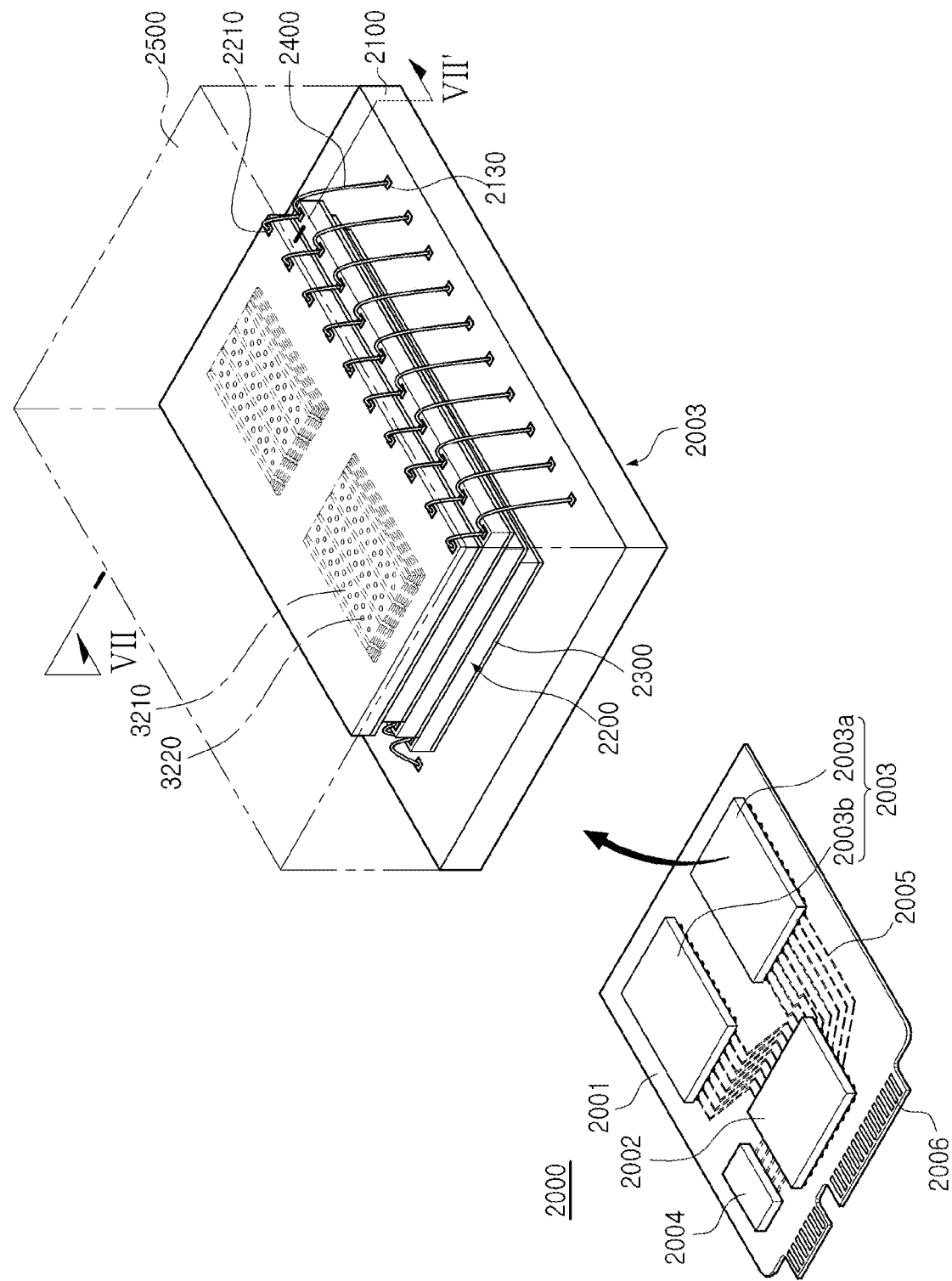
FIG. 13 is a perspective view of a data storage system including a semiconductor device according to an example embodiment of the present disclosure.

FIG. 13 is a perspective view of a data storage system including a semiconductor device according to an example embodiment.

Referring to FIG. 13, a data storage system 2000 according to an example embodiment may include a main substrate 2001, a controller 2002 mounted on the main substrate 2001, one or more semiconductor packages 2003, and a DRAM 2004. The semiconductor package 2003 and the DRAM 2004 may be connected to the controller 2002 by interconnection patterns 2005 formed on the main substrate 2001.

The main substrate 2001 may include a connector 2006 including a plurality of pins coupled to an external host. The number and the arrangement of the plurality of pins in the connector 2006 may be varied depending on a communication interface between the data storage system 2000 and the external host. In an implementation, the data storage system 2000 may communication with the external host through a universal serial bus (USB), a peripheral component interconnect express (PCI-Express), a serial advanced technology attachment (SATA), or an M-phy for universal flash storage (UFS). In an implementation, the data storage system 2000 may operate by power supplied from the external host through the connector 2006. The data storage system 2000 may further include a power management integrated circuit (PMIC) for distributing power supplied from the external host to the controller 2002 and the semiconductor package 2003.

The controller 2002 may write data in the semiconductor package 2003 or may read data from the semiconductor package 2003, and may improve an operation speed of the data storage system 2000.

The DRAM 2004 may be a buffer memory for mitigating a difference in speeds between the semiconductor package 2003, a data storage space, and an external host. The DRAM 2004 included in the data storage system 2000 may also operate as a cache memory, and may provide a space for temporarily storing data in a control operation for the semiconductor package 2003. When the DRAM 2004 is included in the data storage system 2000, the controller 2002 further may include a DRAM controller for controlling the DRAM 2004 in addition to the NAND controller for controlling the semiconductor package 2003.

The semiconductor package 2003 may include first and second semiconductor packages 2003a and 2003b spaced apart from each other. Each of the first and second semiconductor packages 2003a and 2003b may be configured as a semiconductor package including a plurality of semiconductor chips 2200. Each of the first and second semiconductor packages 2003a and 2003b may include a package substrate 2100, semiconductor chips 2200 on the package substrate 2100, adhesive layers 2300 disposed on a lower surface of each of the semiconductor chips 2200, a connection structure 2400 electrically connecting the semiconductor chips 2200 to the package substrate 2100, and a molding layer 2500 covering the semiconductor chips 2200 and the connection structure 2400 on the package substrate 2100.

The package substrate 2100 may be a printed circuit board including the package upper pads 2130. Each of the semiconductor chips 2200 may include an input and output pad 2210. The input and output pad 2210 may correspond to the input and output pad 1101 in FIG. 12. Each of the semiconductor chips 2200 may include gate stack structures 3210 and channel structures 3220. Each of the semiconductor chips 2200 may include the semiconductor device described with reference to FIGS. 1 to 6.

In an implementation, the connection structure 2400 may be a bonding wire electrically connecting the input and output pad 2210 to the package upper pads 2130. Accordingly, in each of the first and second semiconductor packages 2003a and 2003b, the semiconductor chips 2200 may be electrically connected to each other through a bonding wire method, and may be electrically connected to the package upper pads 2130 of the package substrate 2100. In an implementation, in each of the first and second semiconductor packages 2003a and 2003b, the semiconductor chips 2200 may be electrically connected to each other by a connection structure a through silicon via (TSV), instead of the connection structure 2400 of a bonding wire method.

In an implementation, the controller 2002 and the semiconductor chips 2200 may be included in a single package. In an implementation, the controller 2002 and the semiconductor chips 2200 may be mounted on a separate interposer substrate different from the main substrate 2001, and the controller 2002 may be connected to the semiconductor chips 2200 by interconnections formed on the interposer substrate.

Figure 14:
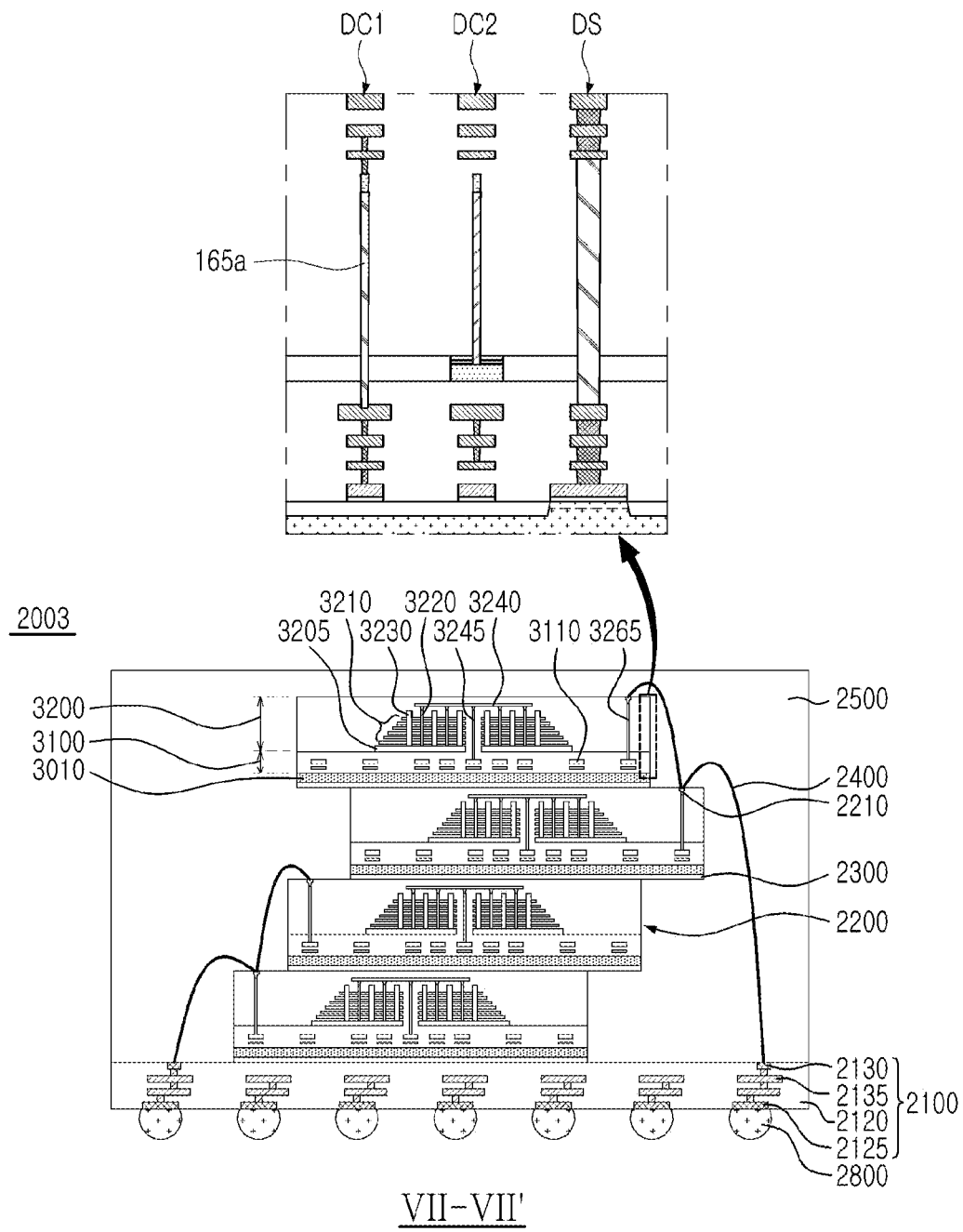
FIG. 14 is a cross-sectional view of a semiconductor package according to an example embodiment of the present disclosure.

FIG. 14 is a cross-sectional view of a semiconductor device according to an example embodiment. FIG. 14 illustrates an example embodiment of the semiconductor package 2003 in FIG. 13, and illustrates the semiconductor package 2003 in FIG. 13 taken along line VII-VII'.

Referring to FIG. 14, in the semiconductor package 2003, the package substrate 2100 may be a printed circuit board. The package substrate 2100 may include a package substrate body portion 2120, package upper pads 2130 (see FIG. 13) on an upper surface of the package substrate body portion 2120, lower pads 2125 on a lower surface of the package substrate body portion 2120 or exposed through the lower surface, and internal interconnections 2135 electrically connecting the upper pads 2130 to the lower pads 2125 in the package substrate body portion 2120. The upper pads 2130 may be electrically connected to the connection structures 2400. The lower pads 2125 may be connected to the interconnection patterns 2005 of the main substrate 2010 of the data storage system 2000 through conductive connection portions 2800 as in FIG. 13.

Each of the semiconductor chips 2200 may include a semiconductor substrate 3010 and a first structure 3100 and a second structure 3200 stacked in order on the semiconductor substrate 3010. The first structure 3100 may include a peripheral circuit region including peripheral interconnections 3110. The second structure 3200 may include a common source line 3205, a gate stack structure 3210 on the common source line 3205, channel structures 3220 and separation structures 3230 penetrating the gate stack structure 3210, bit lines 3240 electrically connected to the memory channel structures 3220, and contact plugs 3235 electrically connected to the word lines WL (see FIG. 12) of the gate stack structure 3210. As described with reference to FIGS. 1 to 6, the dam structure DS may be on an outermost region in each of the semiconductor chips 2200, and at least one defect detector DC1 and DC2 may be in the dam structure DS. In the defect detectors DC1 and DC2, the through via 165a may have a bar shape.

Each of the semiconductor chips 2200 may include a through interconnection 3245 electrically connected to the peripheral interconnections 3110 of the first semiconductor structure 3100 and extending into the second semiconductor structure 3200. The through interconnection 3245 may be on an external side of the gate stack structure 3210, and may penetrate the gate stack structure 3210. Each of the semiconductor chips 2200 may further include an input and output pad 2210 (see FIG. 13) electrically connected to the peripheral interconnections 3110 of the first semiconductor structure 3100.

By way of summation and review, one method of increasing data storage capacity of a semiconductor device may include a semiconductor device including memory cells arranged three-dimensionally, instead of memory cells arranged two-dimensionally.

According to the aforementioned example embodiments, by optimizing the shape of the through via in the defect detector, a semiconductor device having improved reliability and a data storage system including the same may be provided.

One or more embodiments may provide a semiconductor device having improved reliability.

One or more embodiments may provide a data storage system including a semiconductor device having improved reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a substrate having a first region, a second region surrounding the first region, and a third region surrounding the second region;
a memory structure on the first region;
a first defect detector on the second region; and
a dam structure on the third region,
wherein the memory structure includes driving circuits including a first circuit gate electrode layer, a first lower interconnection structure including first lower interconnection lines and first lower contact plugs on the driving circuits, a plate layer on the first lower interconnection structure, gate electrodes stacked and spaced apart from each other on the plate layer in a first direction perpendicular to an upper surface of the plate layer, channel structures penetrating the gate electrodes, extending in the first direction, and each including a channel layer, a first upper interconnection structure on the gate electrodes and the channel structures and including first upper interconnection lines and first upper contact plugs, and first through vias extending in the first direction and connecting the first upper interconnection structure to the first lower interconnection structure,
wherein the first defect detector includes a second circuit gate electrode layer, a second lower interconnection structure including second lower interconnection lines and second lower contact plugs connected to the second circuit gate electrode layer, second through vias on the second lower interconnection structure, and a second upper interconnection structure on the second through vias and including second upper interconnection lines and second upper contact plugs,
wherein the dam structure surrounds the first defect detector and includes a plurality of conductive lines stacked on the third region,
wherein in the first defect detector, the second circuit gate electrode layer, the second lower interconnection structure, the second through vias, and the second upper interconnection structure surround the memory structure, and
wherein the second through vias are connected to an uppermost second lower interconnection line among the second lower interconnection lines, have a first length in an extension direction of the uppermost second lower interconnection line, and have a second length less than the first length in a direction perpendicular to the extension direction.

2. The semiconductor device as claimed in claim 1, wherein the first defect detector is:
spaced apart from the memory structure and the dam structure, and
electrically separated from the memory structure and the dam structure.

3. The semiconductor device as claimed in claim 1, wherein the second lower interconnection structure, the second upper interconnection structure, and the second through vias have structures corresponding to the first lower interconnection structure, the first upper interconnection structure, and the first through vias, respectively.

4. The semiconductor device as claimed in claim 3, wherein:
the second lower interconnection lines and the second lower contact plugs are on substantially the same level as a level of the first lower interconnection lines and the first lower contact plugs, respectively, and include the same material as those of the first lower interconnection lines and the first lower contact plugs, respectively,
the second upper interconnection lines and the second upper contact plugs are on substantially the same level as a level of the first upper interconnection lines and the first upper contact plugs, respectively, and include the same material as those of the first upper interconnection lines and the first upper contact plugs, respectively, and
the second through vias are on substantially the same level as a level of the first through vias, and have substantially the same size and the same shape as those of the first through vias.

5. The semiconductor device as claimed in claim 1, wherein a ratio of the first length to the second length is within a range of about 1.2 to about 1.5.

6. The semiconductor device as claimed in claim 5, wherein the first length is within a range of about 100 nm to about 200 nm.

7. The semiconductor device as claimed in claim 1, wherein, in the first defect detector, unit structures including the second circuit gate electrode layer, the second lower interconnection structure, the second through vias, and the second upper interconnection structure are continuously connected to each other to identify an electrical connection state.

8. The semiconductor device as claimed in claim 1, further comprising a second defect detector surrounding the first defect detector on the second region and having a structure different from a structure of the first defect detector.

9. The semiconductor device as claimed in claim 8, wherein, in the second defect detector, unit structures in which at least a portion of the second lower interconnection lines and the second lower contact plugs are connected to each other are continuously connected to each other to identify an electrical connection state.

10. The semiconductor device as claimed in claim 1, wherein:
the substrate includes an active region, and
a portion of lowermost second lower contact plugs among the second lower contact plugs are connected to the active region, and another portion of the lowermost second lower contact plugs among the second lower contact plugs are connected to the second circuit gate electrode layer.

11. The semiconductor device as claimed in claim 1, wherein the first defect detector has a circular ring shape or a square ring shape surrounding the memory structure in a plan view.

12. The semiconductor device as claimed in claim 1, wherein:
the third region includes outer ends of the substrate in a plan view, and
the dam structure is on an outermost part of the third region.

13. The semiconductor device as claimed in claim 1, wherein, in the dam structure, one of the plurality of conductive lines is on substantially the same level as a level of the first through vias and the second through vias.

14. A semiconductor device, comprising:
a substrate;
a memory structure on the substrate and including memory cells;
a first defect detector surrounding the memory structure; and
a dam structure surrounding the first defect detector,
wherein the first defect detector includes a circuit gate electrode layer on the substrate, a lower interconnection structure connected to the circuit gate electrode layer and including lower interconnection lines and lower contact plugs, through vias on the lower interconnection structure, and an upper interconnection structure on the through vias and including upper interconnection lines and upper contact plugs,
wherein the dam structure includes a plurality of conductive lines surrounding the first defect detector and being vertically stacked,
wherein the first defect detector has a first circuit region surrounding the memory structure and a second circuit region on one end of the first circuit region,
wherein, in the first defect detector, the circuit gate electrode layer, at least a portion of the lower interconnection structure, and the upper interconnection lines are in the first circuit region and the second circuit region, and the through vias and the upper contact plugs are in the second circuit region,
wherein the circuit gate electrode layer surrounds the memory structure, and
wherein the through vias are connected to an uppermost lower interconnection line among the lower interconnection lines, have a first length in an extension direction of the uppermost lower interconnection line, and have a second length smaller than the first length in a direction perpendicular to the extension direction.

15. The semiconductor device as claimed in claim 14, wherein, in the first circuit region, the circuit gate electrode layer is spaced apart from the lower contact plugs to not be connected to the lower contact plugs.

16. The semiconductor device as claimed in claim 14, wherein the first defect detector includes a dummy plate layer and dummy plate contacts spaced apart from the lower interconnection structure and the upper interconnection lines and between the lower interconnection structure and the upper interconnection lines in the first circuit region.

17. The semiconductor device as claimed in claim 14, wherein the memory structure includes layers corresponding to the circuit gate electrode layer, the lower interconnection structure, the through vias, and the upper interconnection structure of the first defect detector, respectively.

18. The semiconductor device as claimed in claim 17, further comprising a second defect detector surrounding the first defect detector and between the first defect detector and the dam structure,
wherein the second defect detector has a structure different from a structure of the first defect detector.

19. The semiconductor device of claim 14, wherein the first defect detector is spaced apart from the memory structure and is electrically separated from the memory structure.

20. A data storage system, comprising:
a semiconductor storage device including a substrate, a memory structure including driving circuits and memory cells on the substrate, a defect detector surrounding the memory structure, a dam structure surrounding the defect detector, and an input/output pad electrically connected to the driving circuits; and
a controller electrically connected to the semiconductor storage device through the input/output pad and controlling the semiconductor storage device,
wherein:
the defect detector includes a circuit gate electrode layer on the substrate, a lower interconnection structure connected to the circuit gate electrode layer and including lower interconnection lines and lower contact plugs, through vias on the lower interconnection structure, and an upper interconnection structure on the through vias and including upper interconnection lines and upper contact plugs,
the dam structure includes a plurality of conductive lines surrounding the defect detector and being vertically stacked,
the through vias are connected to an uppermost lower interconnection line among the lower interconnection lines, have a first length in an extension direction of the uppermost lower interconnection line, and have a second length smaller than the first length in a direction perpendicular to the extension direction,
wherein the defect detector is spaced apart from the memory structure and the dam structure and is electrically separated from the memory structure and the dam structure.

* * * * *